United States Patent [19]

Bolton et al.

[11] Patent Number: 5,532,435

[45] Date of Patent: Jul. 2, 1996

[54] POWER CORD STRAIN RELIEF FOR ROOM AIR CONDITIONER

[75] Inventors: Theodore S. Bolton, Liverpool; Stephen Stopyra, Syracuse, both of N.Y.

[73] Assignee: Carrier Corporation, Syracuse, N.Y.

[21] Appl. No.: 208,400

[22] Filed: Mar. 9, 1994

[51] Int. Cl.⁶ .............................. H05K 5/03; H01R 13/58
[52] U.S. Cl. .................. 174/135; 174/50; 174/66; 439/457; 439/459
[58] Field of Search .................... 174/65 R, 50, 174/66, 151, 135; 439/449, 456, 457, 458, 459; 248/56, 27.1, 73, 222.3, 239

[56] References Cited

U.S. PATENT DOCUMENTS

| | | | |
|---|---|---|---|
| 2,289,992 | 7/1942 | Petersen | 439/458 X |
| 2,309,741 | 2/1943 | Woodward | 439/458 |
| 3,873,959 | 3/1975 | Harvey | 174/135 X |
| 3,879,571 | 4/1975 | Reed | 174/65 R |
| 3,974,661 | 8/1976 | Ferdelman et al. | 62/262 |
| 4,210,380 | 7/1980 | Brzostek | 439/456 |
| 4,648,680 | 3/1987 | Gamarra | 439/459 |
| 4,969,795 | 11/1990 | Toyoda et al. | 414/744.2 |
| 5,285,349 | 2/1994 | Zander et al. | 174/65 R X |
| 5,332,397 | 7/1994 | Ingalsbe | 439/456 X |
| 5,398,532 | 3/1995 | Janssen et al. | 70/252 |
| 5,422,198 | 6/1995 | Lin | 439/449 X |

*Primary Examiner*—Kristine L. Kincaid
*Assistant Examiner*—Paramita Ghosh

[57] ABSTRACT

According to the present invention a one-piece molded strain relief structure for an electrical conductor is provided which includes a body portion having a tortuous path directly molded therein for receiving and guiding the conductor. The tortuous path includes an entrance and exit and further includes at least two changes in direction therealong. In a preferred embodiment the tortuous path is substantially S-shaped and is adapted to receive an electrical conductor having a flat cross section. The tortuous path is configured to confine the flat electrical conductor in a first orientation adjacent the entrance thereof and to cause twisting of the conductor to a second orientation angularly disposed from the first orientation as it approaches the exit thereof. A guide is provided adjacent the exit for imparting a sharp bend in the conductor as it passes therefrom.

2 Claims, 19 Drawing Sheets

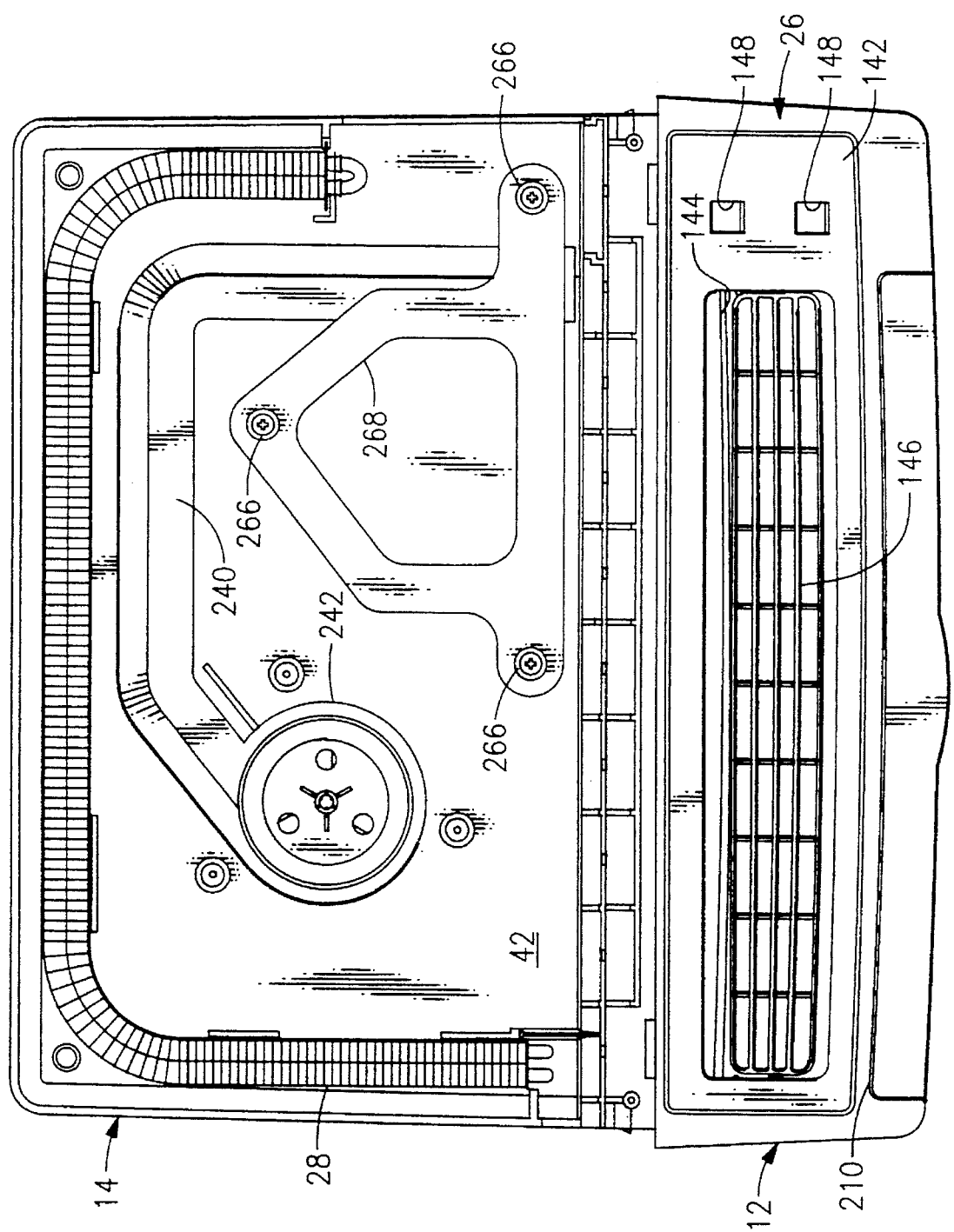

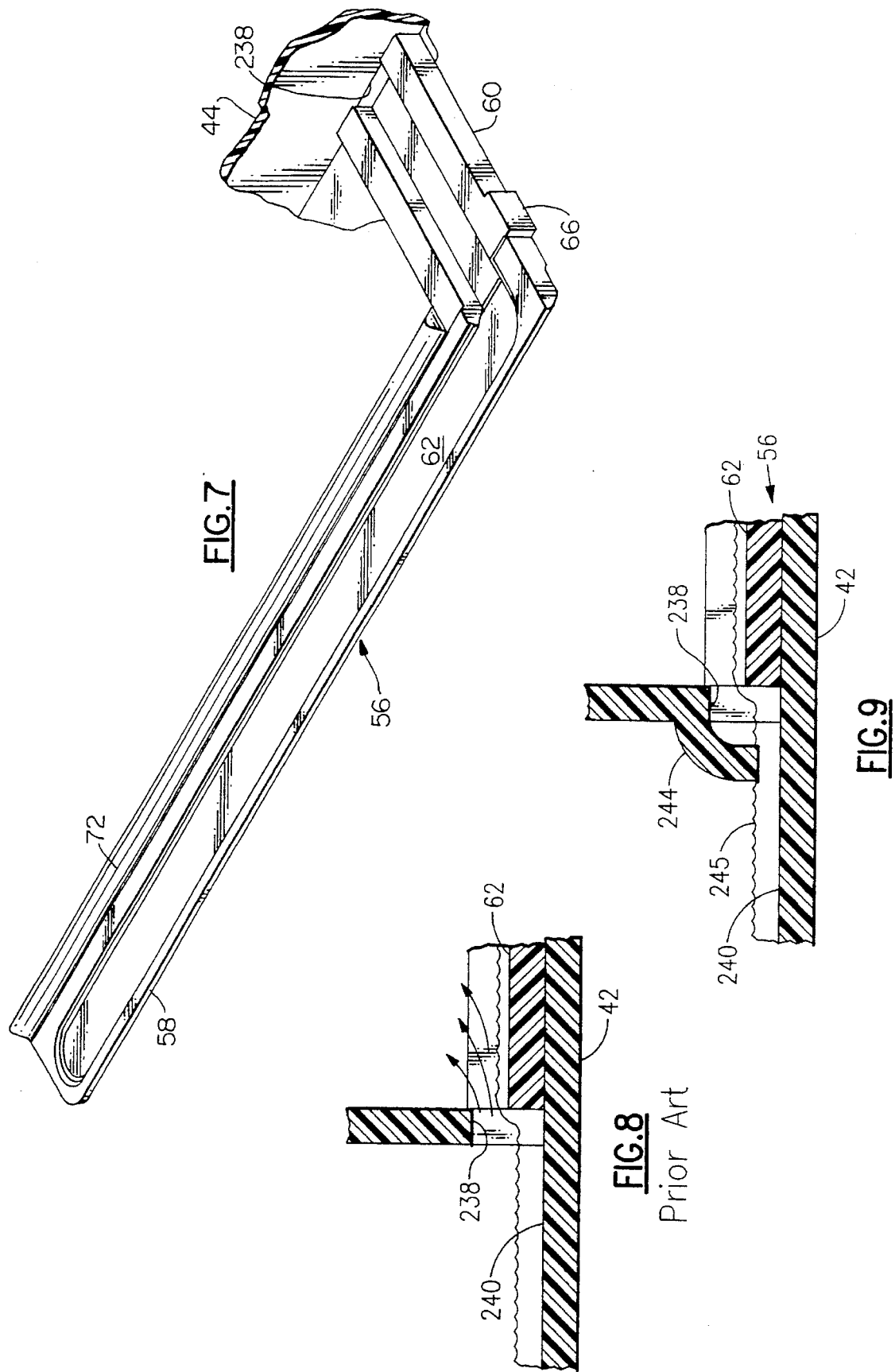

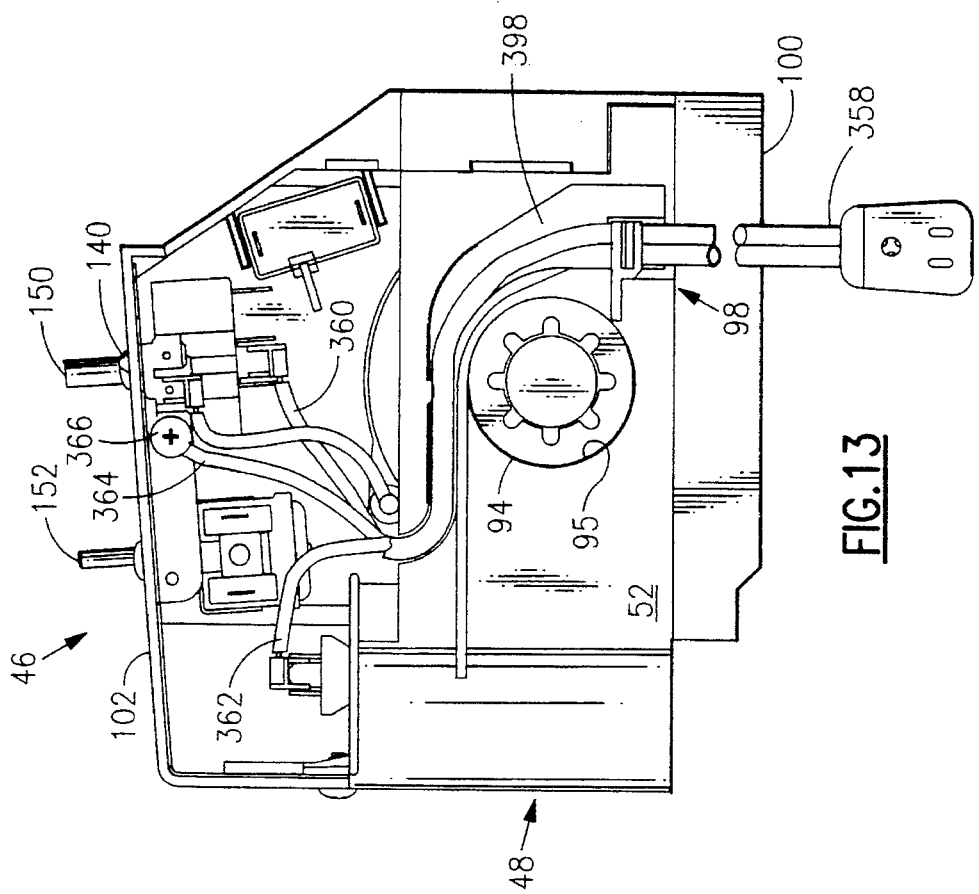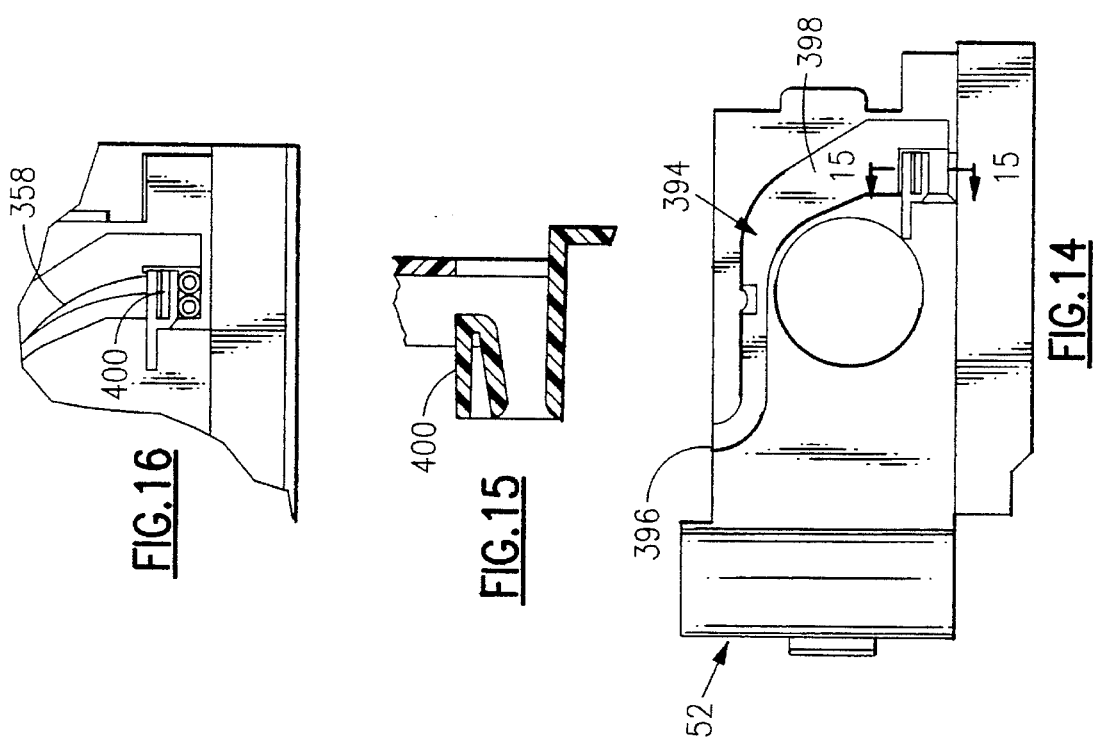

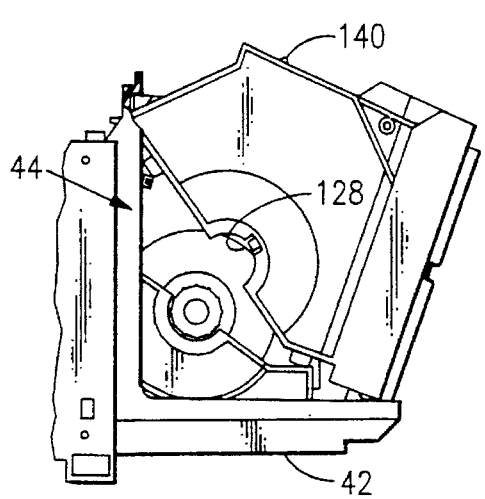
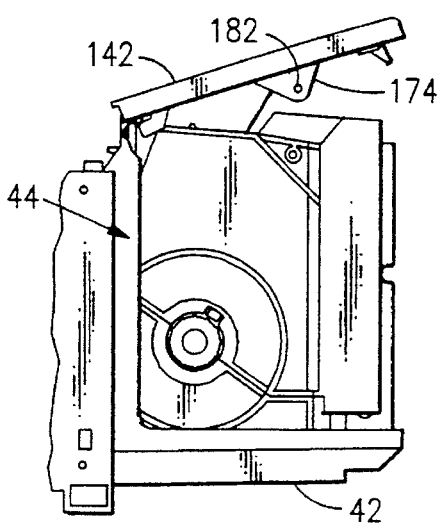
FIG.22    FIG.23
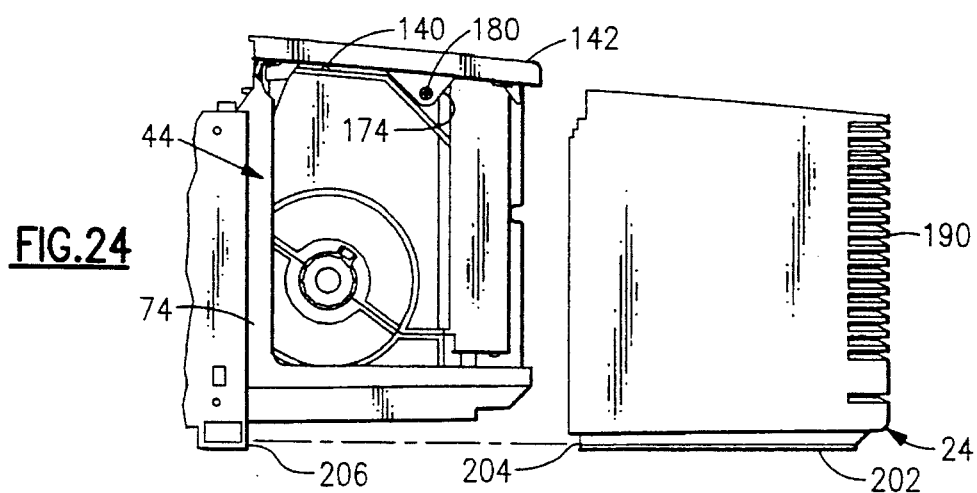
FIG.24
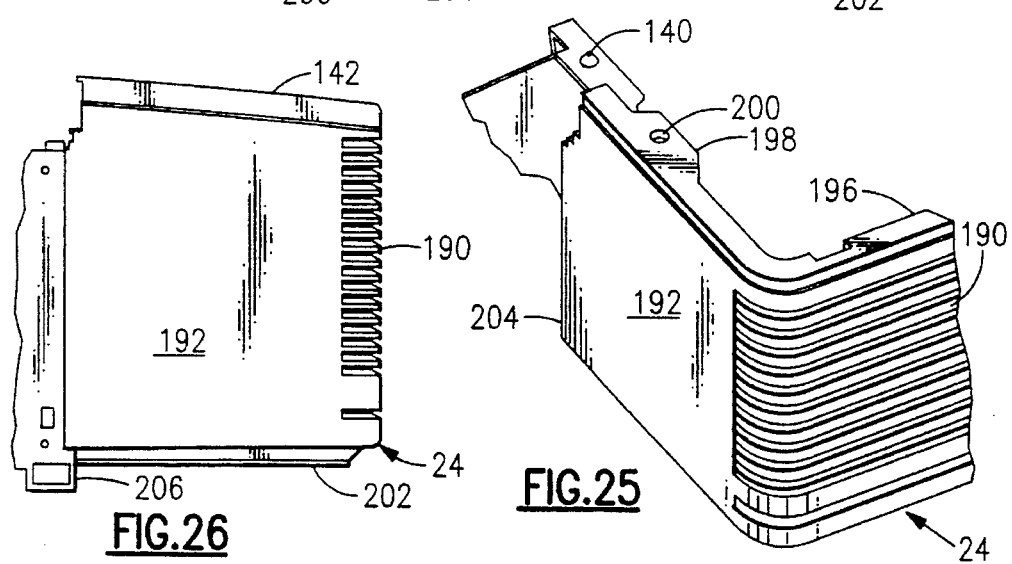
FIG.26    FIG.25

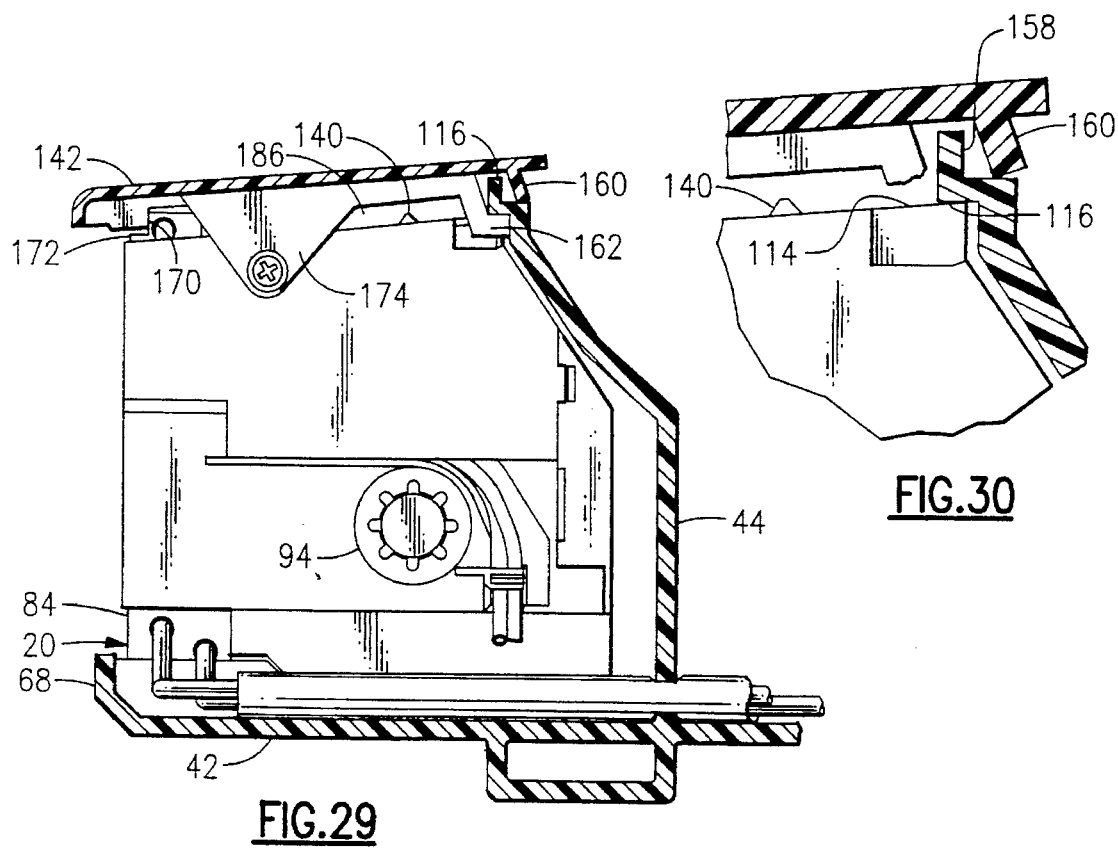
FIG.30
FIG.29
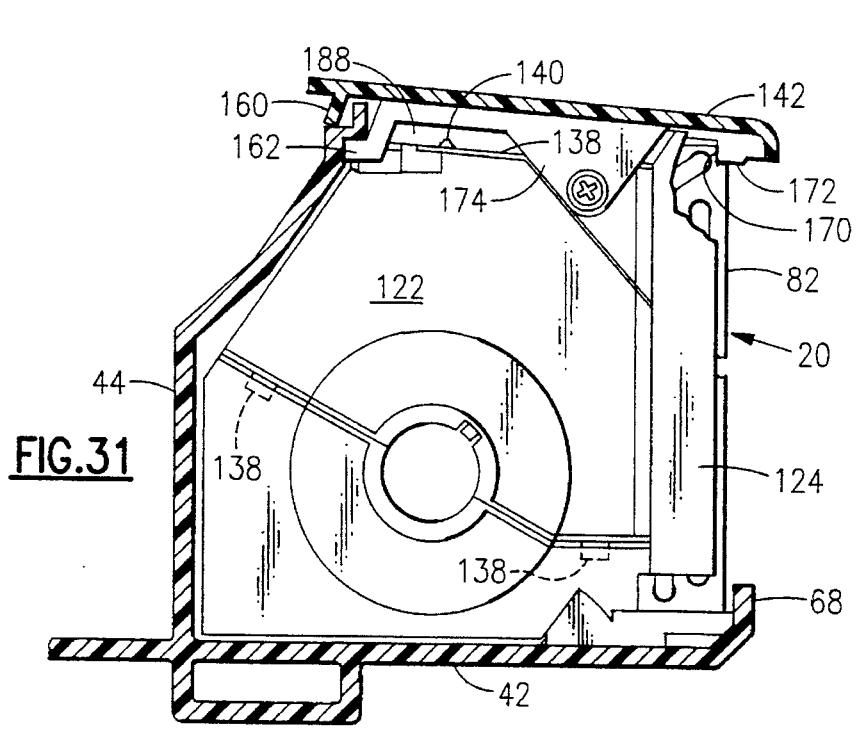
FIG.31

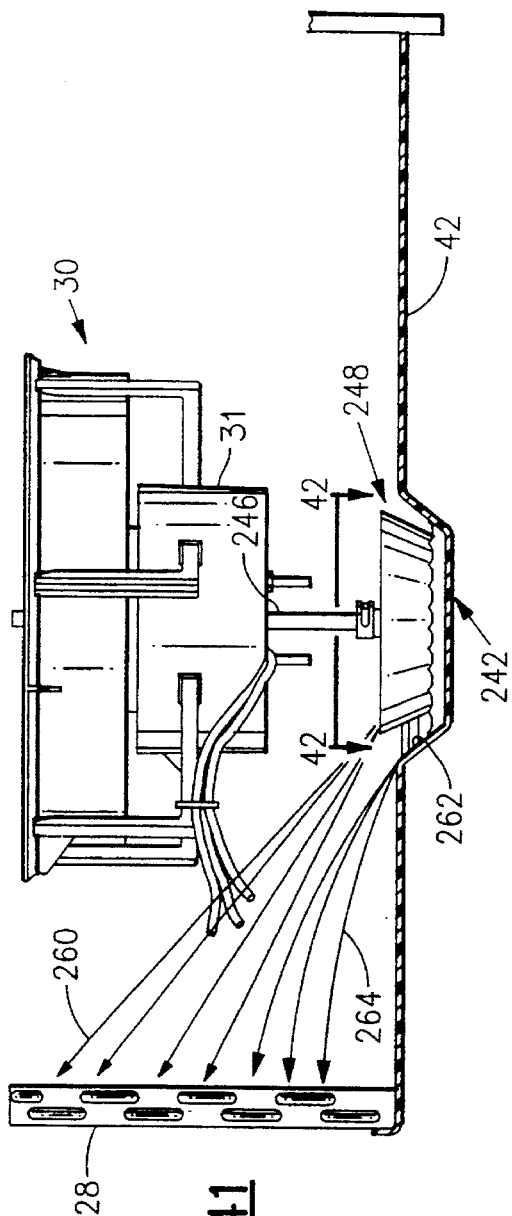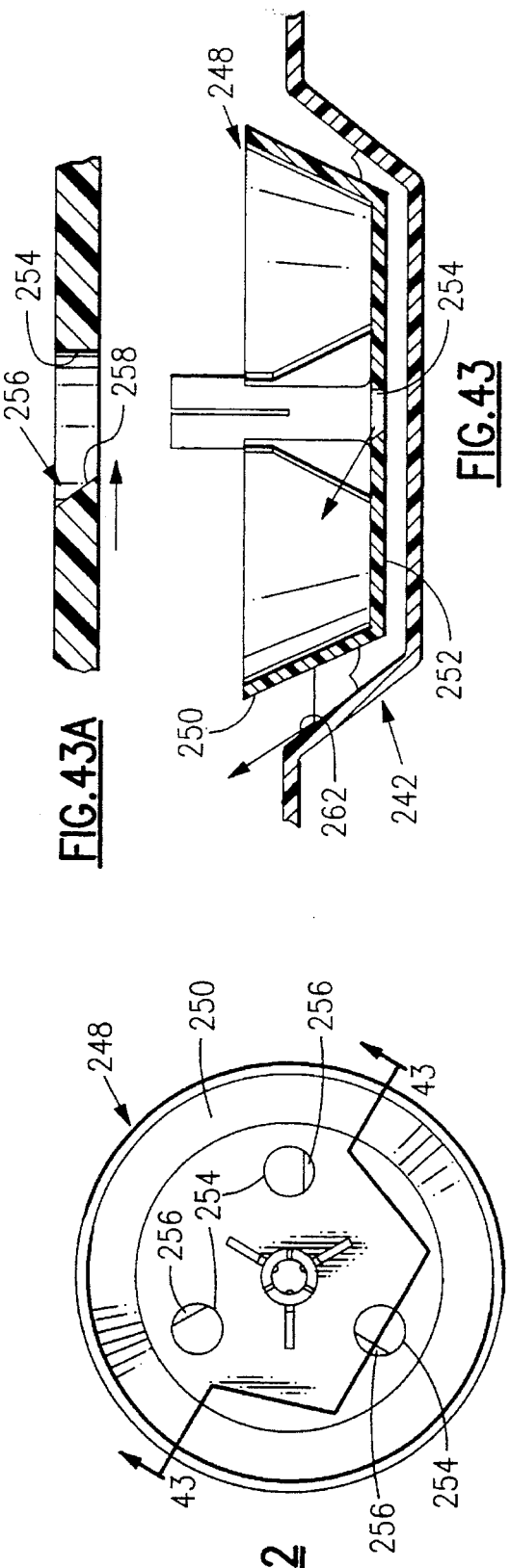

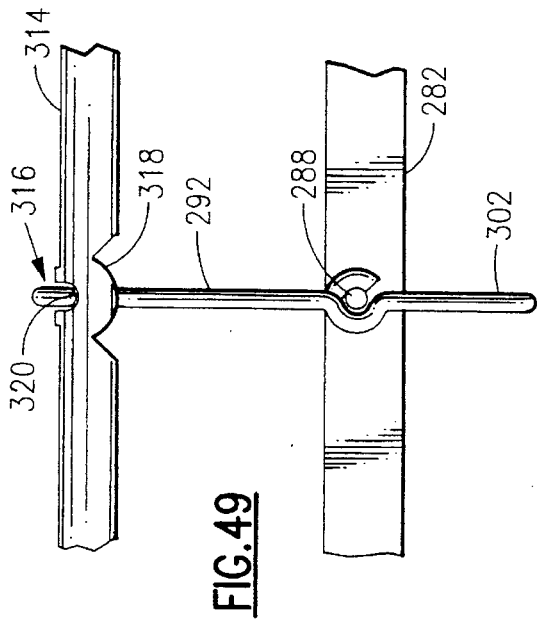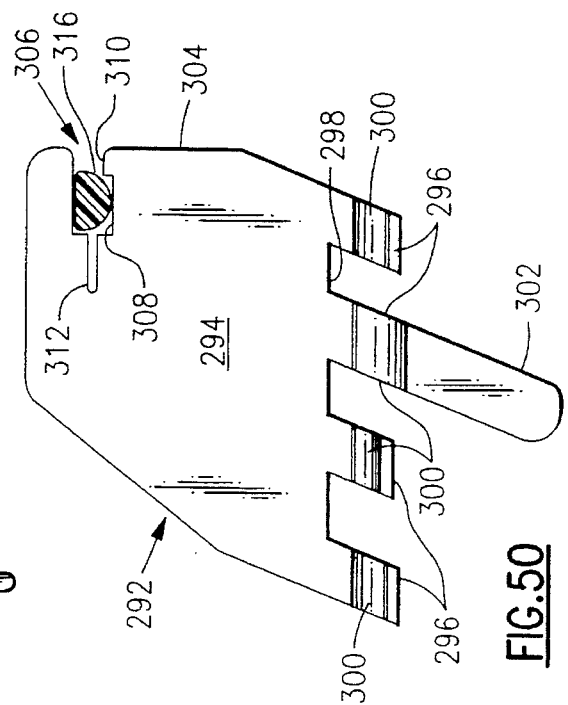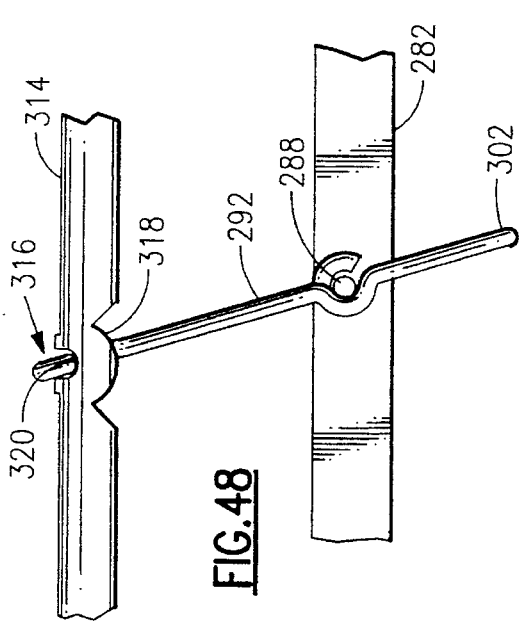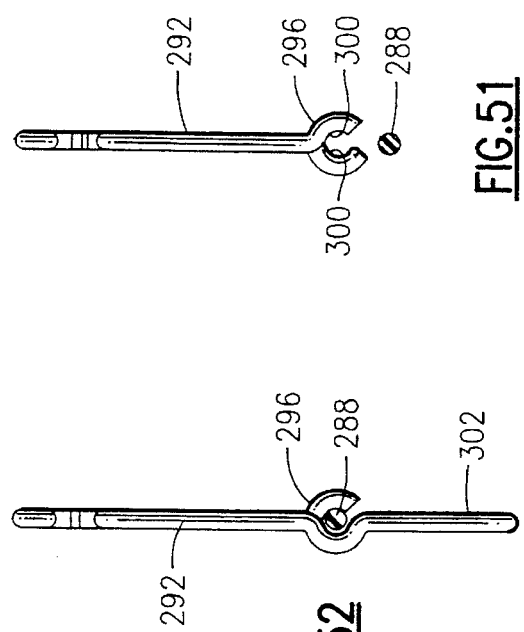

5,532,435

POWER CORD STRAIN RELIEF FOR ROOM AIR CONDITIONER

BACKGROUND OF THE INVENTION

This invention relates generally to strain reliefs for power cords, and, more particularly to an arrangement for use with an electrical service cord at a location where the cord passes from a control box used in an electrical appliance or the like.

In electrical appliances, it is highly desirable that some means be provided for taking the strain exerted by the electrical power cord if the cord is accidentally pulled in a direction tending to disconnect it from the appliance. One expedient for this purpose is to merely tie a knot in the wire leads inside the wall of the appliance, with the knot being too large to be pulled outwardly through an opening in the wall. This arrangement, however, has the disadvantage that is may cause the insulation on the wire to wear very rapidly at the location of the knot, and thereby create a dangerous short circuit condition. To overcome this and other disadvantages of the simple knot arrangement, various, generally satisfactory, types of grommets or bushings have been designed in the past for taking the strain forces exerted by wire leads in a manner decreasing the tendency for damage to the power cord or any parts to which it is connected. Typically as mentioned above such strain relief devices include an additional component such as a grommet, or bushing or the like.

The general object of the present invention is to provide an improved strain relief arrangement for the above described application.

Another object of the invention is to provide a strain relief arrangement which forms an integral part of an existing component of an electrical appliance.

A further, more specific object of the invention is to provide a strain relief arrangement which forms an integral part of a molded cover for an electrical control box for an electrical appliance.

SUMMARY OF THE INVENTION

According to the present invention a one-piece molded strain relief structure for an electrical conductor is provided which includes a body portion having a tortuous path directly molded therein for receiving the conductor. The tortuous path includes an entrance and exit and further includes at least two changes in direction therealong. In a preferred embodiment the tortuous path is substantially S-shaped and is adapted to receive an electrical conductor having a flat cross section. The tortuous path is configured to confine the flat electrical conductor in a first orientation adjacent the entrance thereof and to cause twisting of the conductor to a second orientation angularly disposed from the first orientation as it approaches the exit thereof. Means are provided adjacent the exit for imparting a sharp bend in the conductor as it passes therefrom.

BRIEF DESCRIPTION OF THE DRAWINGS

This invention may be better understood and its numerous objects and advantages will become apparent to those skilled in the art by reference to the accompanying drawings, in which:

FIG. 6 is a top elevational view of the air conditioner of FIG. 1, similar to FIG. 5, with the indoor covers installed and a number of the outdoor components removed;

FIG. 7 is a perspective view of the condensate drain pan which shows in a simplified manner its cooperation with the condensate opening in the partition wall of the air conditioner of FIG. 1;

FIG. 8 is a sectional view showing the prior art relationship between a condensate base pan, the drain pan and the condensate opening;

FIG. 9 is a sectional view, similar to FIG. 8, showing the condensate outlet of the present invention;

FIG. 13 is a view similar to FIG. 12 showing the power cord installed in the strain relief;

FIG. 14 is a plan view of the lower cover of the control box;

FIG. 15 is a view taken along the line 15—15 of FIG. 14;

FIG. 16 is a fragmentary showing of the lower right hand corner of FIG. 13 with the power cord cut away where it exits from the strain relief;

FIG. 22 is a view similar to FIG. 18 showing the bearing bracket moving into engagement with the scroll;

FIG. 23 shows the bearing bracket and coil in their final positions, and, the discharge deck being assembled thereto;

FIG. 24 through 26 illustrate the assembly of the indoor grill to the assembled front end;

FIG. 29 shows a sectional right hand end view of the air conditioner of FIG. 1 with the control box discharge deck and indoor coil installed;

FIG. 30 is a fragmentary view of the upper right hand corner of FIG. 29 with a portion of the discharge deck broken away to show engagement of the control box with the center partition;

FIG. 31 is a view similar to FIG. 29 showing the left hand end of the air conditioner with the front end fully assembled;

FIG. 41 is a simplified view of the outside fan, evaporator base pan and slinger arrangement of the air conditioner of FIG. 1;

FIG. 42 is a top view of the slinger of FIG. 41 as viewed along the line 42—42 thereof;

FIG. 43 As a sectional view of the slinger of FIG. 42 taken along the line 43—43 thereof;

FIG. 43A is a enlarged view of the slinger opening shown in FIG. 43;

FIGS. 48 and 49 illustrate the engagement and relative movement of a single deflector and its gang bar relative to the discharge louver housing;

FIG. 50 illustrates a plan view of a single deflector with a handle as engaged with the gang bar; and FIGS. 51 and 52 illustrate the engagement of a deflector, without and with a handle, with the discharge louver.

DESCRIPTION OF THE PREFERRED EMBODIMENT

Figure 1:
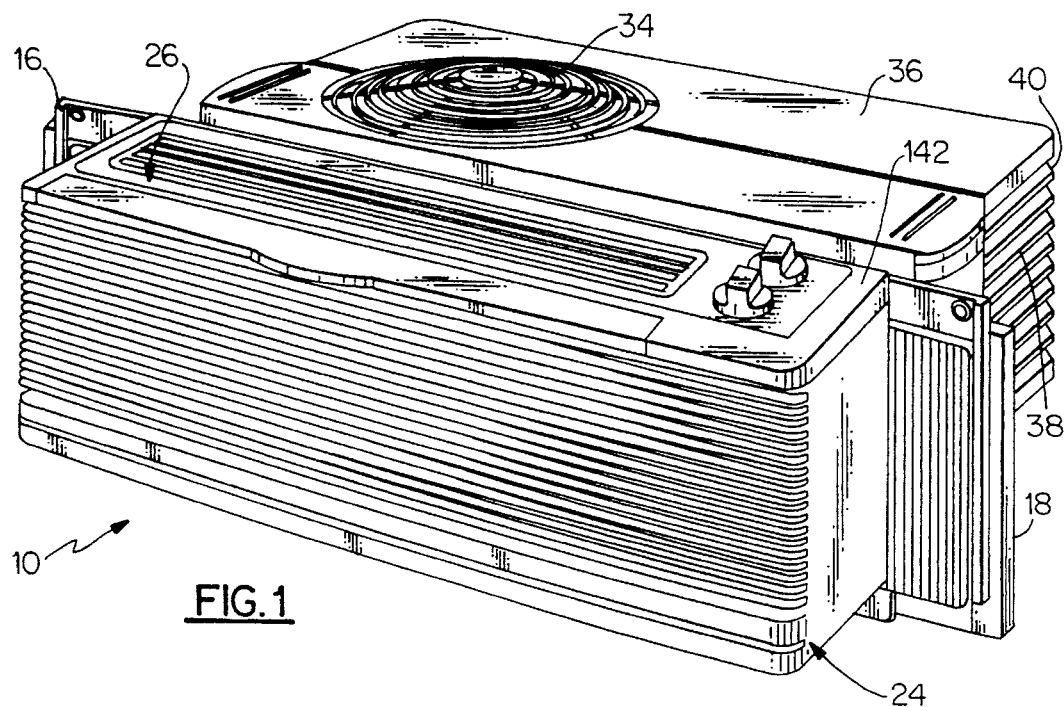
FIG. 1 is a perspective view of a portable room air conditioner which embodies the features of this invention.

With reference initially to FIG. 1, a portable windowtype air conditioner unit 10 is formed of an indoor section 12 and an outdoor section 14. The unit is adapted to be positioned on a windowsill in a room where cooling is desired, with the indoor section facing into the room. The window sash is closed onto the top of the unit 10, and left and right side curtains 16, 18 open outward to close the remaining window space. The inside section 12 comprises an inside refrigerant-to-air heat exchanger 20 and an inside fan 22. Air from the space to be conditioned by the system enters the inside section 12 through air inlet louvers formed in an inside grill 24, and passed through the heat exchanger 20 where the air is either heated or cooled, and the inside fan 22 before exiting from the inside section 12 through an inside air discharge assembly, generally 26.

The outside section 14, of the unit is outside of the space whose air is to be conditioned. This section contains, as best seen with reference to FIGS. 4 and 5 an outside refrigerant-to-air heat exchanger 28, an outside fan 30, an outside fan motor 31, and a compressor 32. In operation, outside air enters the outside section 14 through a circular louvered air inlet 34 positioned above the outside fan in an otherwise solid outside top cover 36. The air entering the outside section then passes through the outside fan 30 into the interior of the outside section from where it is forced through the outside heat exchanger 28 before exiting from the outside section 14 through discharge louvers 38. The louvers 38 are formed in a U-shaped rear enclosure 40. The louvers 38 are configured so as to direct the warm air exiting from the outside section downwardly and away from the air intake 34 so that exiting air will not be "short cycled" through the air inlet 34 directly back into the outside section.

Figure 4:
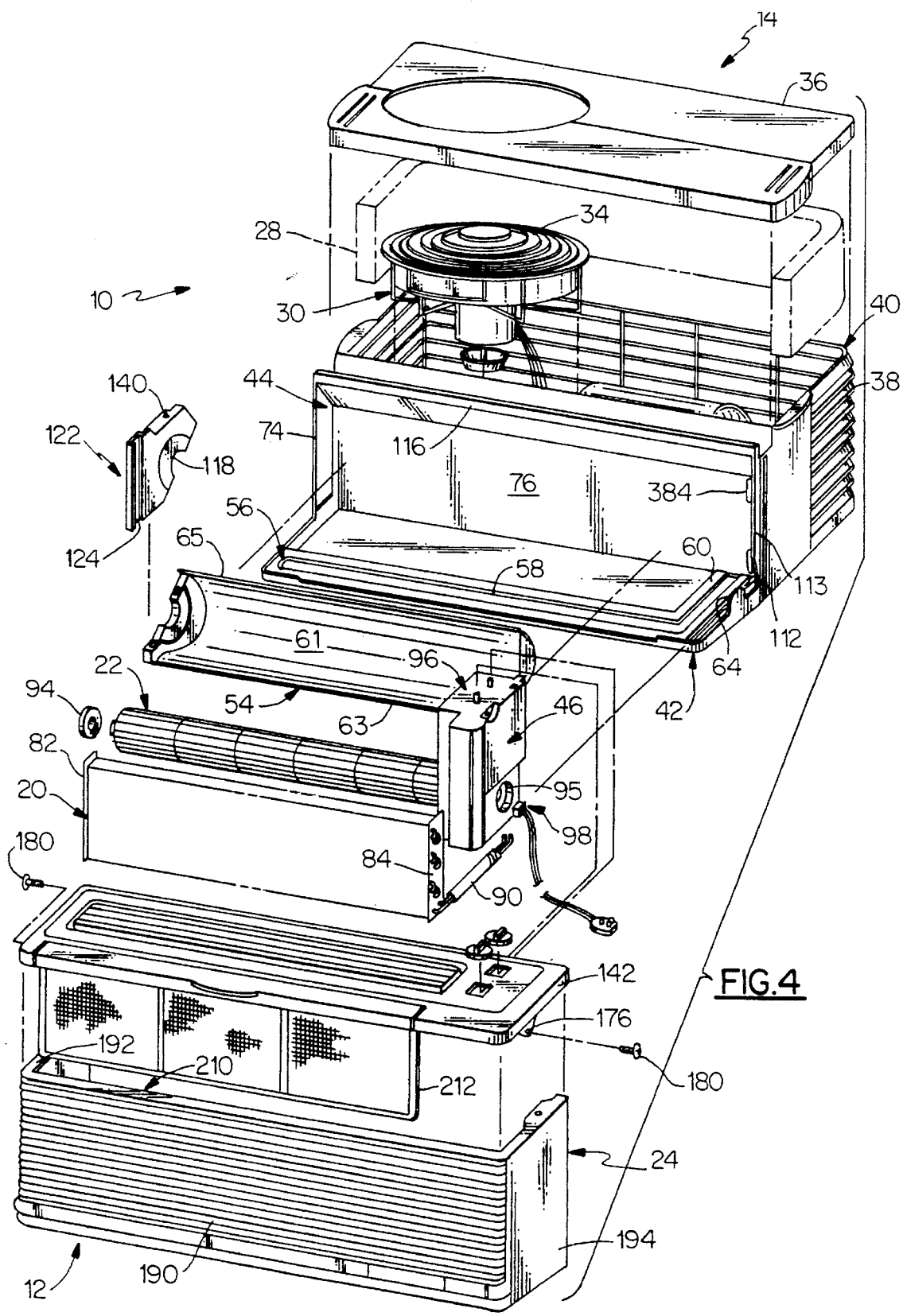
FIG. 4 is an exploded perspective view of the portable window air conditioner unit of FIG. 1.

Best seen in FIGS. 4 and 6 the entire air conditioning unit 10 is supported by a single piece base pan 42. The basepan includes a vertically extending partition 44 which separates the indoor 12 and outdoor 14 sections.

The base pan/partition assembly 42, 44 is precision molded from a polymer material, preferably a foamed glass-filled polycarbonate. As will be appreciated the basepan 42 contains a number of contoured areas and other sections which are designed to cooperate with other components of the air conditioner 10 in order to facilitate assembly of the unit with precision alignment of all components, while at the same time requiring a minimum number of fastening devices such as screws or the like.

Figure 10:
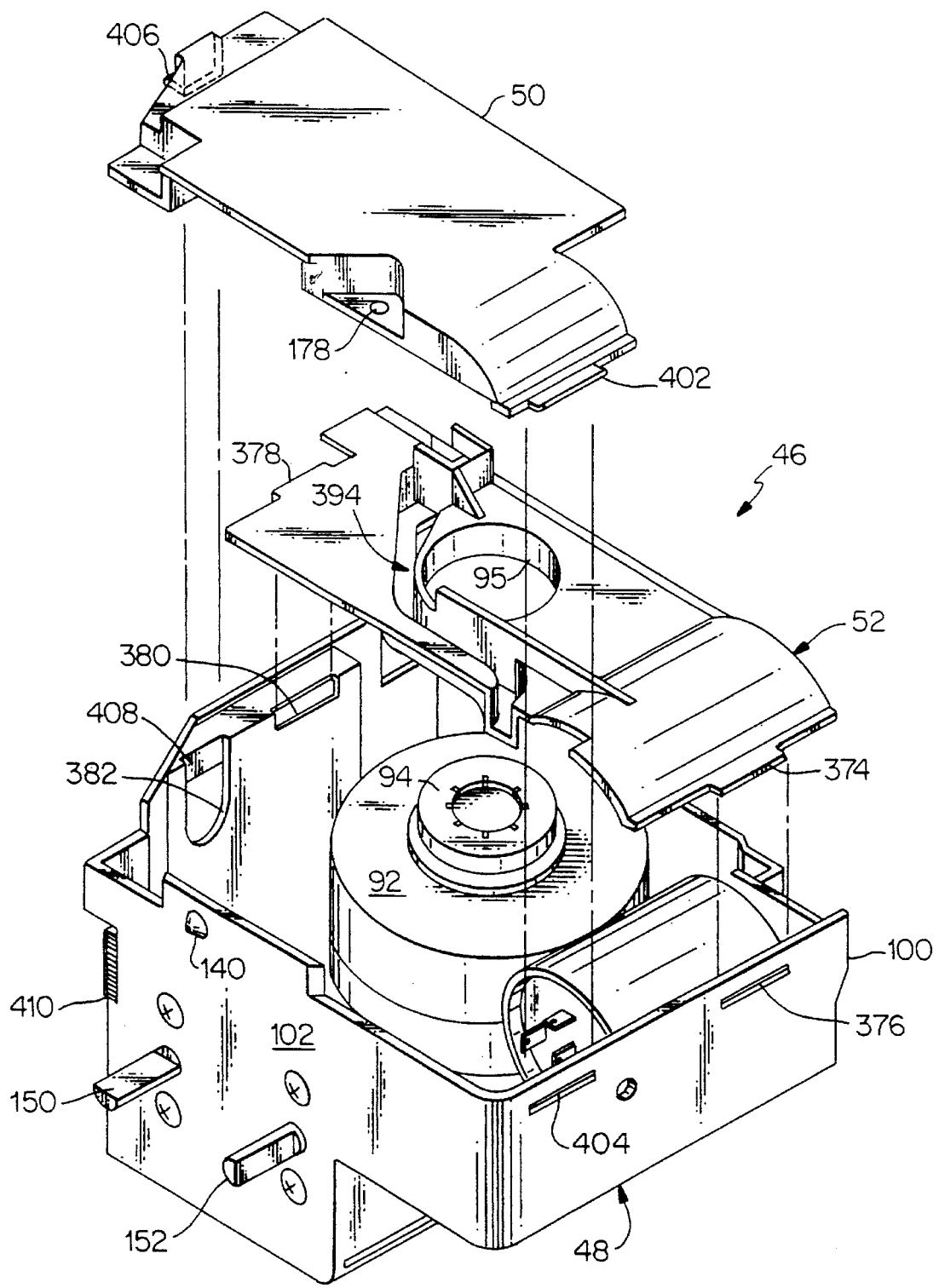
FIG. 10 is an exploded view of the control box enclosure.

Referring now to FIG. 4 a previously unmentioned extremely important component of the air conditioner unit 10 is the control box assembly 46, which will be described in considerable more detail below. The control box is also molded from a polymer material and comprises three pieces, the box itself 48 and upper and lower covers 50 and 52 respectively, as seen in FIG. 10. The control box is designed to house three capacitors, the unit on-off/function switch, the thermostat, the service cord and the indoor fan motor. A further extremely important function of the control box 46 is that, once it is assembled into the unit, it serves to position and align other components of the air conditioning unit as well as to actually position and support the outside grill, as will be seen.

Figure 5:
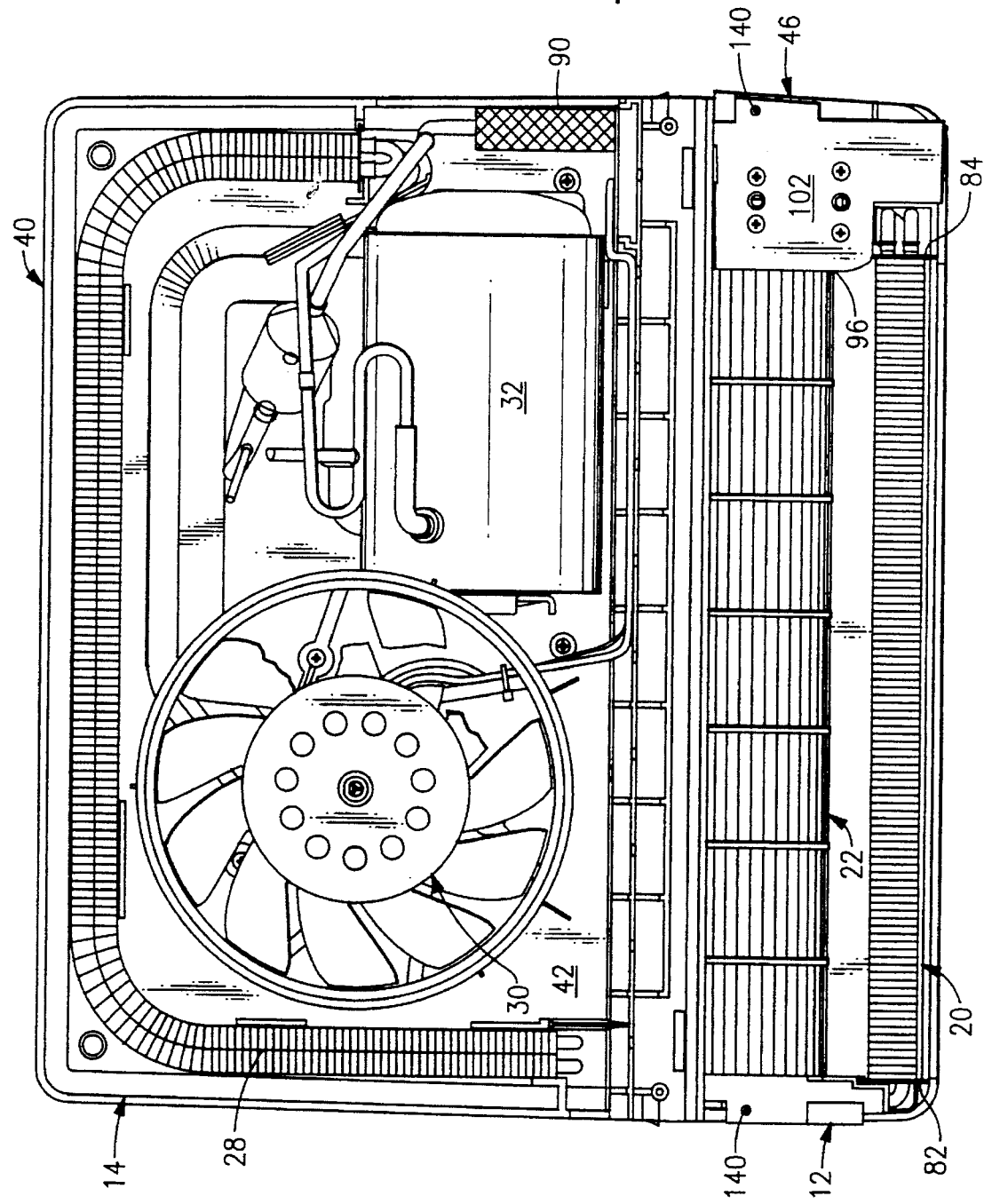
FIG. 5 is a top elevational view of the air conditioner of FIG. 1 with the top cover, outdoor inlet grill, front grill and discharge deck removed.
Figures 18, 19:
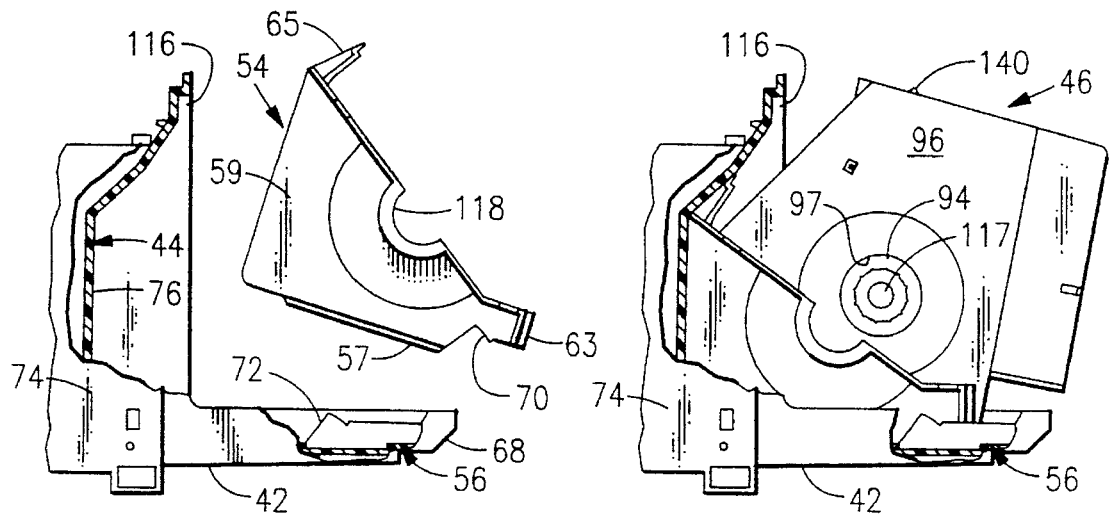
FIG. 18 is a simplified left hand end view of the base pan and vertical partition of the air conditioner of FIG. 1 illustrating the indoor fan scroll being moved into its assembled position therewith.
FIG. 19 is a view similar to FIG. 18 showing the control box being moved into its assembled position.
Figure 38:
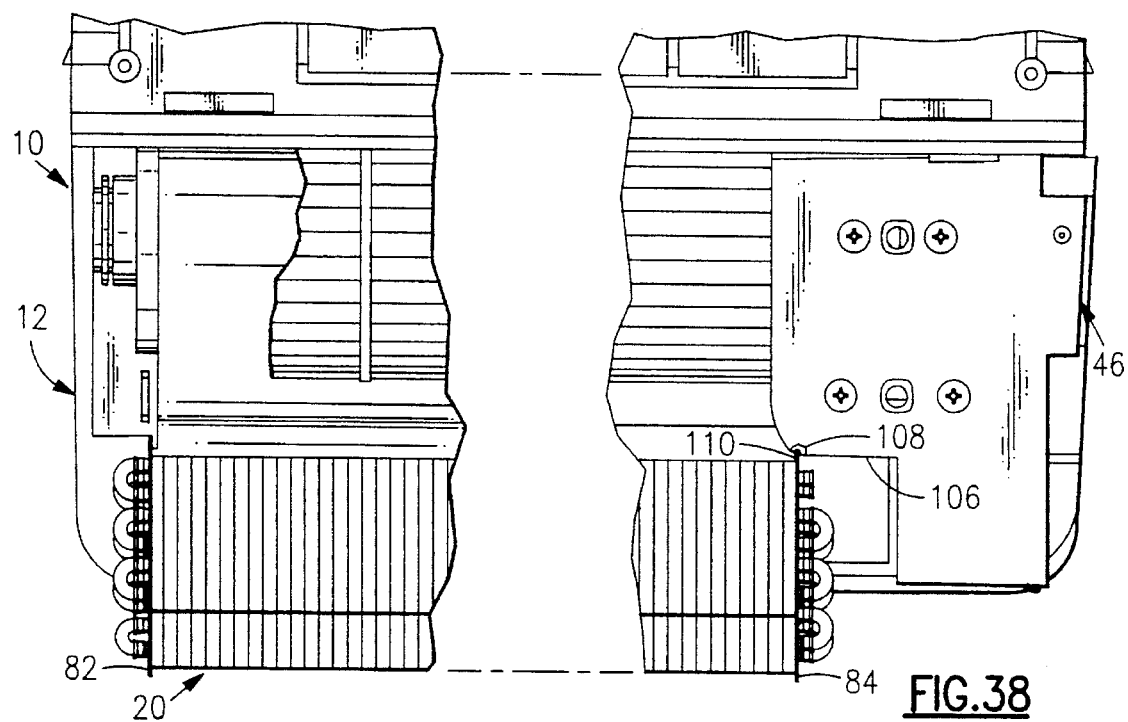
FIG. 38 is a partial plan view of the air conditioner of FIG. 1 with the covers removed and showing the indoor coil in its intermediate assembly position and its engagement with the positioning components of the air conditioning unit.

The indoor fan 22 as best seen in FIGS. 4, 5 and 38 is of the type known as a transverse fan. An impeller for a transverse fan of the type which may be used in connection with this unit is shown and described in U.S. Pat. No. 5,266,007, Impeller For Transverse Fan, assigned to the assignee of the present invention. Generally, the inlet plenum of the transverse fan is defined by the previously described air inlet described in connection with the inside grill 24. The flow path in and around the fan is defined generally by a scroll element 54 as best seen in FIGS. 4 and 18.

Figure 46:
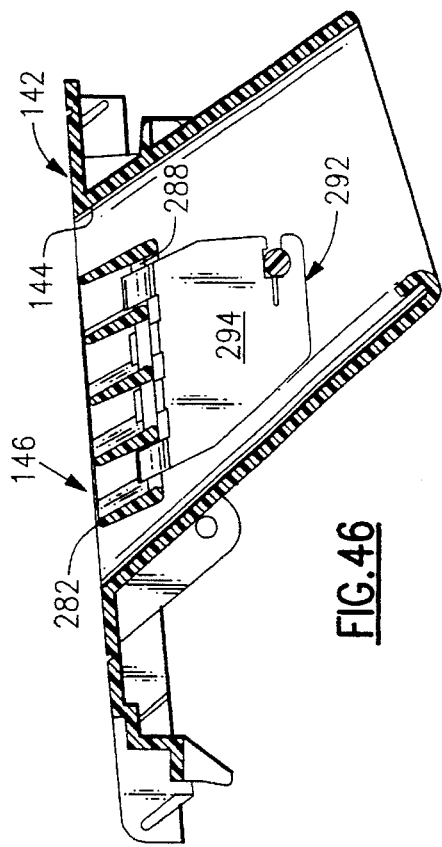
FIG. 46 is a sectional view of the deflector assembly of FIG. 45 showing its relative position as mounted in the discharge deck assembly.

The scroll 54 is an elongated molded plastic piece having a lower wall 57 adapted to engage the basepan 42 and a rear wall 59 adapted to engage the partition 44. An elongated curvilinear surface 61 extending between a front edge 63 and a rear, upper edge 65 defines impart the inlet air flow path. The upper edge 65 of the scroll 54 cooperates with a downwardly extending portion 56 of the inside air discharge assembly 26 as best illustrated in FIG. 46. The general principles of operation of a transverse fan are well known and will not be elaborated upon in any more detail herein.

Indoor Section Assembly

The assembly of all of the indoor components of the air conditioner unit 10 contained in the indoor section 12 will now be described in detail. First, with reference to FIGS. 4 and 7, the condensate pan 56 is first placed in position in the base pan 42. The condensate pan is made from a rigid foam material and comprises an inverted L-shaped section having the longer leg thereof 58 adapted to receive the lower portion of the indoor heat exchanger 20. The shorter leg 60 of the condensate pan is adapted to receive condensate draining from the coil and to direct it through a channel 62 formed therein to the units condensate collection system which will be subsequently described in detail. The condensate pan 56 is positioned in the base pan by an upstanding rib 64 formed in the base pan which contacts an extended portion 66 on the right hand end of the leg 60 of the condensate pan, and by the front flange 68 of the base pan itself.

The indoor fan scroll 54 is then installed. With reference to FIG. 18 it will be seen that the front edge 63 of the scroll is provided with a groove 70 which is adapted to engage a mating surface 72 provided on the back of the long leg 58 of the condensate pan 56. The scroll 54 is thus assembled to the unit as oriented in FIG. 18 with the groove 70 and the mating surface 72 first engaging one another and then rotating the scroll rearwardly until the upper longitudinal edge 65 engages a portion of the inwardly facing wall 76 of the partition 44. The scroll is positioned left to right by a gusset 74 formed in the partition wall 44, a portion of this gusset is broken away in FIG. 18 and it is fully shown in FIG. 4. The right hand end 77 of the scroll is positioned by contact with the short leg 60 of the condensate pan. Accordingly as thus assembled the scroll 54 is self located.

Figure 32:
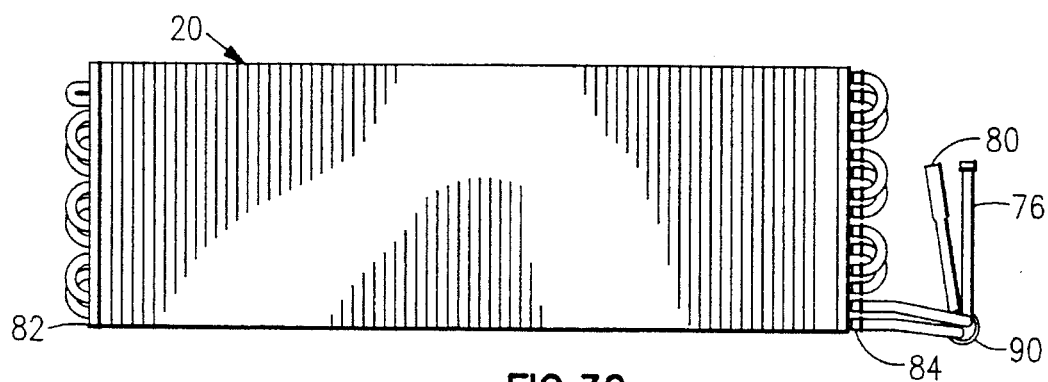
FIG. 32 is a front view of the indoor coil of the air conditioner of FIG. 1.
Figures 33, 34, 35:
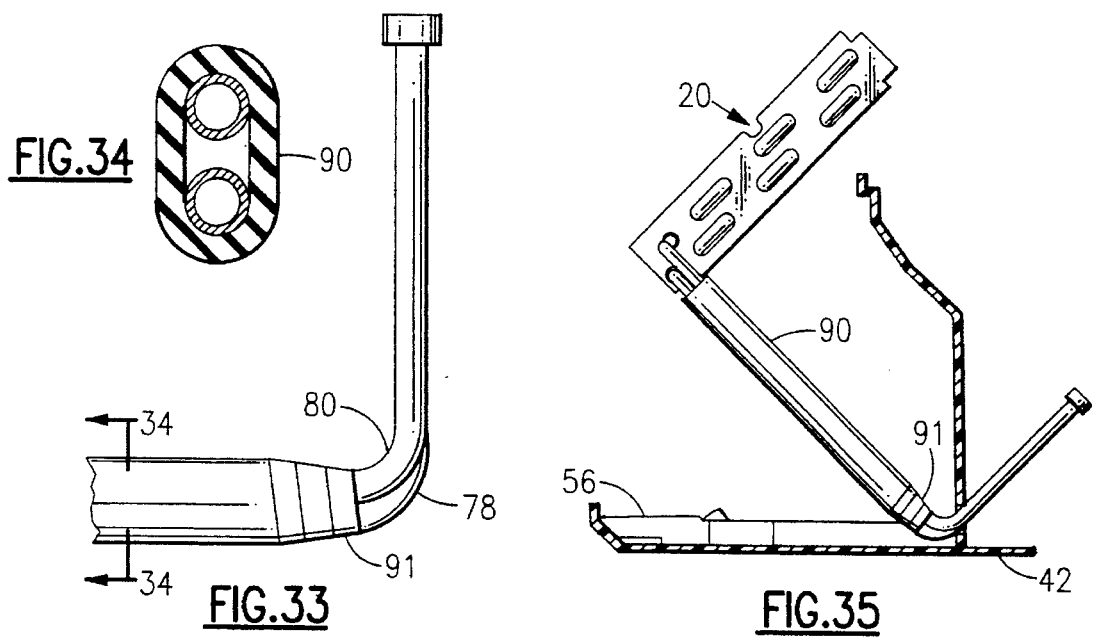
FIG. 33 is an enlarged view showing the tube seal assembled to the inlet and outlet tubes of the coil of FIG. 32.
FIG. 34 is a sectional view taken along the line 34—34 of FIG. 33.
FIGS. 35 through 37 illustrate in a simplified manner the method of assembling the indoor coil with the tube seal assembled thereto through the opening in the partition, and, engagement of the seal with the opening when the coil is positioned in the base pan.
Figures 36, 37:
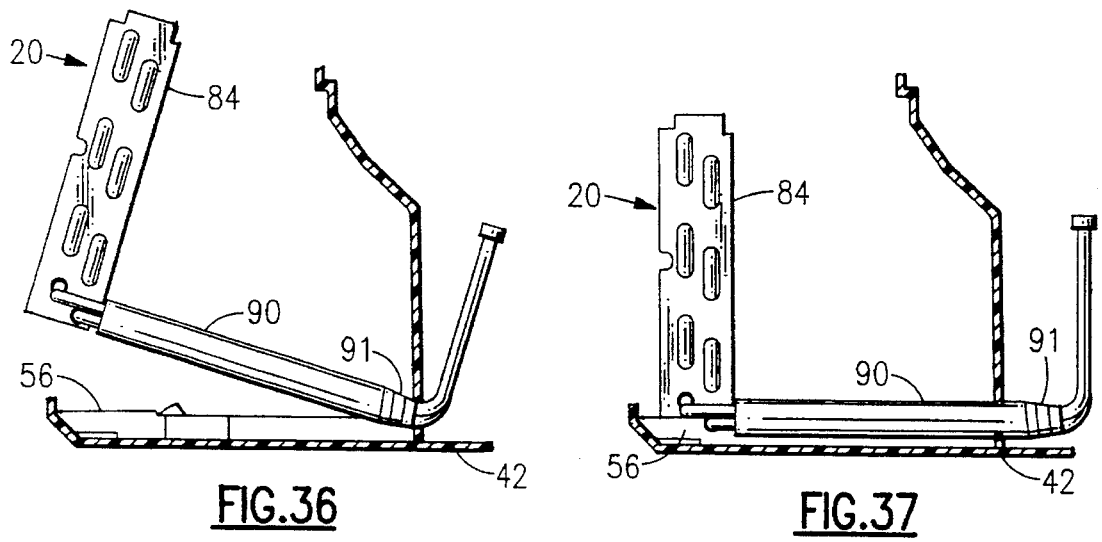

The next step is to install the indoor evaporator coil assembly 20. Looking at FIG. 32 the evaporator coil comprises a continuous section of tubing having a inlet and outlet end 78 and 80 respectively interconnected by a series of serpentine sections supported at the left and right hand ends respectively by left and right hand tube sheets 82 and 84. The tubes are interconnected by a multiplicity of parallel heat exchange enhancing fins 86. The coil inlet and outlet tubes 78 and 80 are adapted to extend from the front end of the basepan 42 of the air conditioning unit 10 through an opening 88 in the partition 44 to the outdoor section 14 where they are eventually interconnected with the rest of the closed refrigeration system.

With reference now to FIGS. 33 through 37, in order to prevent air leakage and water leakage from the outdoor section 14 into the indoor section 12 it is desirable to seal the opening 88 surrounding the two refrigerant tubes passing therethrough. In order to achieve this in an inexpensive, expeditious and highly efficient manner a section of foam rubber hose 90 is slid over the open ends of both hoses and positioned to extend on the longitudinal stretch of tube that extends from the inside section through the opening 88 and into the outdoor section. The insulating tube 90 is then taped 91 to the refrigerant tubes 78 and 80 to prevent the tube from sliding on the tubing as the coil assembly is installed and the tubes are passed through the opening 88. The taping 91 at the end of the tubes that passes through the opening creates a tapered transition thus assuring smooth installation the insulating section 90 enters the hole 88 drawing assembly.

The hole 88 is slightly smaller than the insulating tube 90 so that the tube is compressed slightly during installation. This provides an inexpensive, yet effective air and water tight seal.

Figures 20, 21:
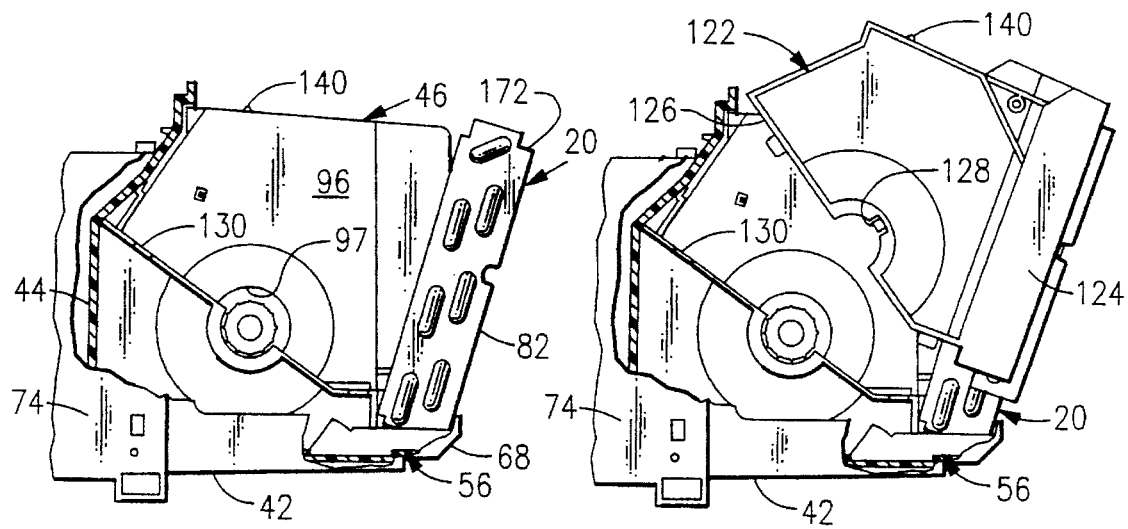
FIG. 20 is a view similar to FIG. 18 showing the control box and indoor coil in their assembled condition.
FIG. 21 is a view similar to FIG. 18 showing the bearing bracket engaging the indoor coil.

Following installation of the coil as described above the evaporator coil 20 is bent forward by about 15 degrees from the vertical, as illustrated in FIGS. 20, 21 and 38. This bending of the coil is temporary and facilitates installation of the control box assembly 46 as will now be described in connection with FIGS. 19 and 20. It should be noted that the indoor coil is not shown in FIG. 19 in order to facilitate the description of the installation of the control box assembly 46.

As previously indicated the control box assembly 46 includes the indoor fan motor 92. The indoor fan motor 92 has a support bushing 94 on both ends thereof. With reference to FIG. 10 it will be seen that one bushing 94 is adapted to be operatively received in an opening 95 in the lower control box cover 52. With reference to FIG. 19 it will be seen that the other motor bushing extends through an opening 97 in the left hand facing wall 96 of the box 48. While the details of the control box structure and the assembly thereof and other novel features associated therewith will be described in detail hereinbelow, for purposes of the present description, the side of the control box defined by the upper and lower covers 50 and 52 respectively will generally be referred to as the right hand side of the control box.

Figure 27:
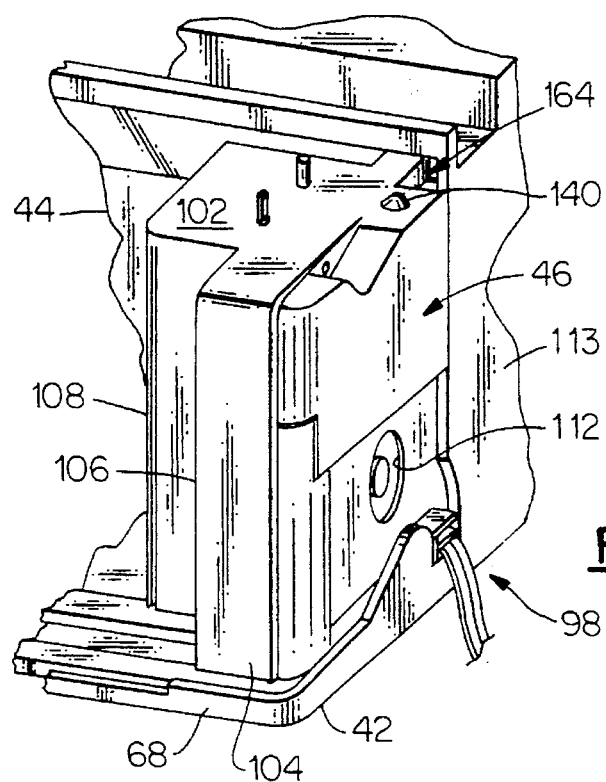
FIGS. 27 and 28 are perspective views showing in detail, respectively, the right and left hand ends of the air conditioner following assembly of the control box and the bearing support structure respectively.
Figure 28:
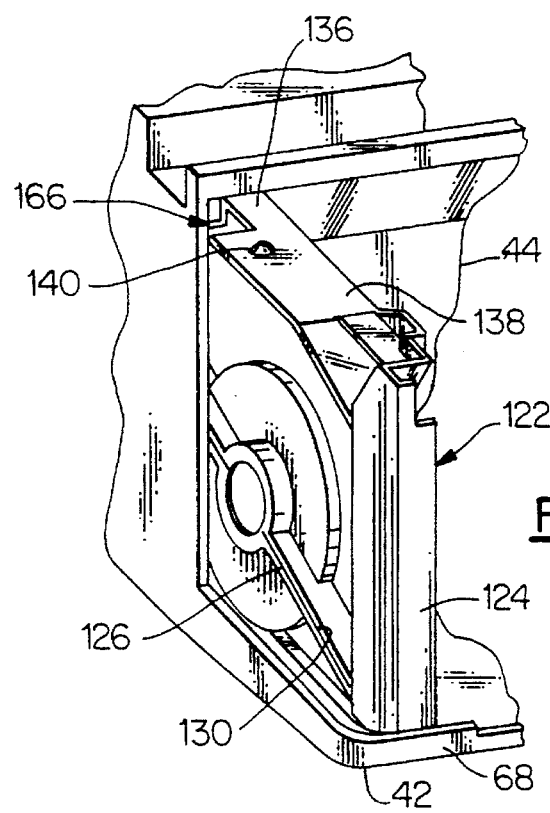

The power cord strain relief generally, 98 extending from the right hand side of the control box will be referred to in connection with installation of the control box assembly. The bottom of the control box will generally be referred to as 100 while the top of the control box will be referred to as 102. As best seen in FIGS. 27 and 28 the front of the control box is stepped having a proximal facing front surface 104 and a distal front facing surface 106. Located in the distal front facing surface 106 of the control box is a vertically extending slot 108.

Installation of the control box is carried out by engaging the slot 108 with the rear flange 110 of the right hand tube sheet 84. As thus engaged the control box relationship to the unit appears as illustrated in FIG. 19. As the control box is moved downwardly the cord strain relief 98 moves into engagement with an arcuate slot 112, which, as best seen in FIGS. 4 and 27, is provided in the right hand base pan gusset 113. The control box 46 is thus guided by the engagement of the slot 108 and the tube sheet, and, the strain relief 98 and the arcuate slot 112.

When the control box has moved downward and rearward as far as it can a protrusion 114 on the top of the control box snaps under an L-shaped rib 116 which is formed on the upper most end of the partition wall 44 as shown in FIGS. 20, 27 and 30. It is important to note that the L-shaped rib 116 extends substantially the full width of the upper partition wall. The control box assembly 46 thus has also been assembled to the air conditioning unit in a precision self locating manner.

Referring now to FIG. 20, as thus installed the axis 117 of the indoor fan motor 92 is an alignment with a semi-circular bearing support 118 formed in the left hand end 120 of the scroll 54. At this point the indoor fan impeller 22 is drivingly attached to the indoor fan drive motor 92, and, a rubber support bearing 120 is placed on the left hand end of the indoor fan impeller. The support bearing 120 is then operatively placed into the bearing support 118 formed in the scroll as shown in FIGS. 4 and 38.

The left hand bearing bracket 122 as best seen in FIGS. 4, 21 and 28 is provided with a vertically extending channel 124, and, a diagonally extending surface 126 which has a semi-circular bearing support structure 128 formed therein. The diagonal surface 126 is adapted to matingly engage a corresponding surface 130 formed on the left hand end of the scroll 54. Extending from the diagonal surface 126 on the bearing bracket are a pair of tabs 132 which are adapted to operatively engage a mating pair of slots 134 provided in the diagonal surface 130 of the scroll.

The bearing bracket 122 is assembled by engaging the channel 124 against the left side of the left tube sheet 82 and sliding it downward until the lower tab 132 on the bracket enters the lower slot 134 in the scroll. The bracket 122 is then rotated rearwardly until the upper tab 132 on the bracket enters the upper slot 134 on the scroll, and, a rearwardly extending protrusion 136 on the upper surface of the bracket 122 snaps under the rib 116 formed at the upper end of the partition 44. The bracket 122 is then locked in place in a precision self locating manner. It should be appreciated, with reference to FIGS. 21 and 28, that as the bracket 122 is rotated rearwardly into its assembled position the indoor coil 20 by virtue of engagement of the bracket with the left hand tube sheet is moved back into its proper vertically oriented position.

Referring now to FIGS. 27 and 28 it will be noted that the top of the control box 102 and the top 138 of the bearing bracket 122 are each provided with an upstanding cone shaped locator pin 140. These locator pins 140, as will be seen in the description hereinbelow, are the primary mounting structure for the inside grille 24.

Continuing now with the indoor section assembly, the indoor air discharge assembly 26 includes a discharge deck 142 which includes an elongated substantially rectangular opening 144 in the top thereof in which is mounted an air deflector assembly 146. The air deflector assembly 146 is shown in detail in FIGS. 45 through 52 and will be described in detail hereinbelow.

The discharge deck 142 includes two spaced apart openings 148 in the right hand top surface thereof which are adapted to allow control shafts 150, 152 of the unit control switch 154 and thermostat 156, respectively, to pass there through.

Assembly and precise positioning of the discharge deck 142 is facilitated by the upper edge 158 of the partition 44 and the previously described L-shaped rib 116 also formed at the upper end of the partition 44, as shown in FIGS. 29, 30 and 31. With continued reference to these figures it will be seen that the deck 142 is provided with a downwardly extending lip 160 on its rear, underside which extends substantially the entire width of the deck. Also, adjacent each end of the deck, and extending from the underside thereof, forward of the lip 160 are a pari of J-shaped ears 162.

With reference to FIG. 23 installation of the deck is achieved by angling the deck away from the horizontal position so as to engage the lip 160 with the upper edge 158 of the partition and substantially rotating the deck downwardly to the horizontal position so that the ears 162 move under the L-shaped rib 116. Reference to FIGS. 27 and 28 illustrate in detail the openings into which the J-shaped ears 162 are received on the right hand end and the left hand end of the unit, respectively.

With reference to FIG. 27 the recess 164 in which the right hand ear 162 is received is defined by the L-shaped rib 116 and a portion cut away in the corner of the control box 46 adjacent to the protruding section 114 which extends under the L-shaped rib 116 of the partition to position the control box. Likewise FIG. 28 shows the recess 166 for receiving the left hand ear 162 which is defined by the rib 116 and a cut out portion 168 adjacent to the protrusion 136 on the bearing bracket 122 which engages the rib 116.

With the lip 160 and the ears 162 so engaged, as the front of the deck is rotated downwardly a downwardly extending offset 170 formed in the front underside of the deck is received in mating notches 172 formed in both the left and right hand tube sheets 82, 84. This engagement of the deck with the notches stops the rotation of the deck downwardly and thus locates the deck and locks the evaporator coil 20 in its final assembled position. FIGS. 29 and 30 illustrate this relationship in detail.

The discharge deck 142 is provided with a substantially triangularly shaped mounting ear 174 extending downwardly from the underside thereof at both the right and left hand ends thereof. Each of the mounting ears 174 is provided with a hole 176 therein. The hole 176 in the right hand mounting ear is in alignment with an engagement hole 178 provided in the upper cover of control box housing 48. Similarly, the opening 182 in the left hand mounting ear 174 is in alignment with an engagement hole 184 formed in the upper end of the bearing bracket 122.

With reference to FIGS. 4, 29 and 31, one screw 180, is installed in each end of the deck 142 through the respective openings 178 and 182 in the ears 174 and into engagement with the holes 178 and 184 of the control box cover and bearing bracket. With the screws 180 appropriately fastened, the entire indoor section is then locked together. Specifically, the discharge deck 142, the control box assembly 146, the bearing bracket 122, the scroll 54, the indoor coil 20 and the basepan 42 are all interlocked, as described hereinabove and fastened with two threaded fasteners such that cannot move in any direction.

Disassembly of the entire front end may be readily accomplished by removing the two fastening screws 180, and easily disassembling each of the components.

Front Inlet Grille Mounting

It will be noted with reference to FIGS. 1, 4, 24, 29 and 31 that with the indoor section assembled as described above, the discharged deck 142 covers substantially the entire upper part of the indoor section 12 of the unit. In order to make the unit aesthetically attractive, the inside or front grille 24 is designed to slide under the discharge deck and top of the filter (the filter will be described hereinbelow) which make up the top of the unit, cover the sides and the front, wrap around the bottom edges and precisely line up with other adjoining parts of the unit.

Reference is made to the previous description, in connection with FIGS. 27 and 28, of the conically shaped locator pins 140 located on the top 138 of the bracket 122 and the top 102 of the control box. It will be noted, with reference to FIGS. 24, 29 and 31 that with the discharge deck 142 installed, a space is defined between the underside of the discharge deck 142 and the top 102 of the control box on the right hand side (186) and the top of the bearing bracket 122 on the left hand side (188).

Referring now to FIGS. 4, 24 through 26 and 29 and 31, the indoor grille 24 is a one piece, molded plastic member, which is adapted to cooperate with the indoor section as illustrated in FIG. 1. The grille 24 has a substantially elongated U-shape, which contains a rectangularly shaped louvered intake section 190 forming the front thereof and a pair of shorter solid sections forming left and right hand sides 192, 194 respectively. The grille 24 includes a top flange 196 extending about the entire upper periphery thereof. Extending from the top flange 196 on both the left and right hand ends thereof are inwardly extending extensions 198 each of which is provided with a locator hole 200 which is adapted to cooperate with the locator pins 140 as will be explained in more detail. A bottom flange 202 extends about the lower perimeter of the grille 26.

The grille 26 is installed by sliding the top flange 196 and the flange extensions 198 into the spaces 186, 188 on the right and left hand sides of the unit respectively. The grille is pushed rearwardly until the flange extensions 198 contact the locator pins 140. The flange extensions 198 then are cammed upwardly due to the conical shape of the locator pins 140 until the locator holes 200 engage the pins and locate the upper part of the grille 26.

At this point the weight of the grille 26 tries to rotate the entire grille downward thus pivoting it on the locator pins 140. When the rear edges 204 of the left and right hand portions 192, 194 of the grille contact a structural rib 206 of the basepan the grille is installed to the unit.

Removal of the grille 26 is accomplished by placing one hand on each side of the grille and simply pulling it forward with sufficient force to cause the flange extensions 198 to cam upwardly causing the locator holes 200 to move out of engagement with the locator pins 140.

As a result, the grill installs easily, is removed easily, and because of the precision location of the locator pins 140, as described hereinabove, the grille lines up precisely with all adjacent parts.

A further benefit is that the grille may be easily removed without tools. This satisfies Underwriters Laboratory® requirement UL-494 and therefore allows the information plate for the air conditioner to be inside the outer grille 26.

Thermostat Capillary Installation

With the indoor section 12 of the unit 10 assembled as described above the inside grille 24 and the front edge 208 of the discharge deck 142 cooperate to define a narrow elongated slot 210 which is adapted to received a removable one piece air filter 212. The air filter 212 has a top portion 214 which has a handle section 216 which when the filter is inserted from the top of the unit downwardly into the slot 210 forms an aesthetically pleasing integral portion of the front of the unit. The filter 212 is shown in its installed position in FIGS. 1, 2 and 4 and, as is conventional, in its installed position is in coextensive closely adjacent relationship to the front of the evaporator coil 20 to intercept and collect any airborne particulate being drawn into the front of the unit through the inside grille 24.

Figure 2:
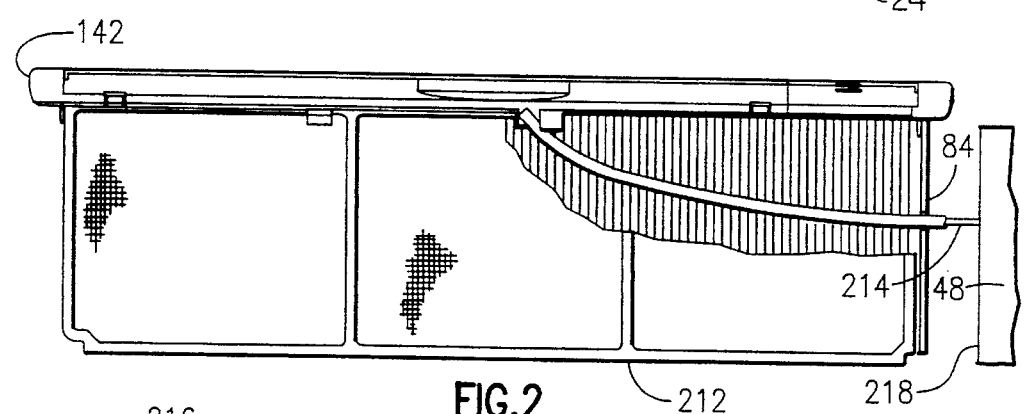
FIG. 2 is a simplified front view of the air conditioner of FIG. 1 showing the relative positions of the indoor coil, the filter and the thermostat capillary mounting.
Figures 3, 3A:
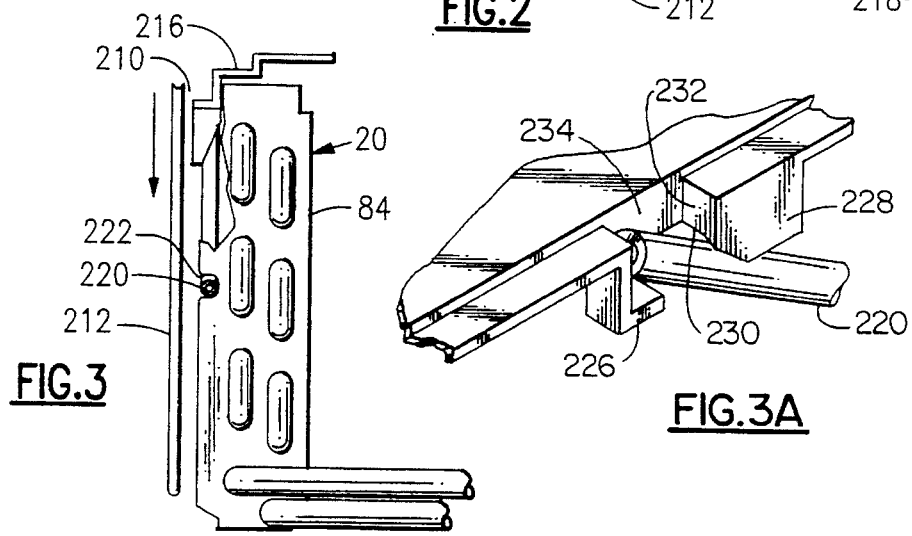
FIG. 3 is a sectional side view of the evaporator, filter and thermostat capillary shown in FIG. 2.
FIG. 3A is an enlarged perspective view of the end of the capillary engaging the discharge deck.

It is common practice in room air conditioner units to mount the units thermostat capillary 214 across the face of the indoor coil 20 so that it may sense the room air as it flows into the unit and across the capillary before entering the coil to be cooled. The capillary is generally located close to the coil surface (about ⅛ to ¼ inch away). As a result, if the coil begins to ice up the ice will build up until it touches the capillary causing the thermostat to open and shut the compressor off. Also, typically, capillaries are sleeved in plastic to protect them from radiant cooling from the coil. Typically the capillary and the sleeve in which it is contained are attached to the coil by retainers which extend outwardly from the coil so as to space the capillary as discussed above. Such retainers can and have been known to interfere with the installation of slide-in filters of the type also described above. Referring now to FIGS. 2, 3 and 3A, the relationship of the thermostat capillary 214, the air filter 212, the indoor coil 20 and the front edge 216 of the discharge deck 142 are shown.

As shown in FIG. 2 the capillary 214, encased in a plastic sleeve 220, extends from the left hand facing surface 218 of the control box 48 and extends to the left into confronting relationship with the inside coil 20. The front edge of the right hand tube sheet 84 is provided with a notch 222 into which the plastic sleeve 220 is pushed as shown in FIG. 3. The front edge 216 of the deck is provided with a L-shaped downwardly extending configuration 224 which defines a horizontal wall portion 226. Spaced to the right of the horizontal wall portion 226 is a vertically, downwardly extending wall section 228 which defines a space 230 therebehind. The horizontal wall 226 and the left hand edge 232 of the vertical wall 228 define an opening 234 therebetween.

Accordingly, after the plastic sleeve 220 is inserted into the notch 222 the upper end 236 of the sleeve 220 is snapped into the opening 234 with a portion of the upper end resting on horizontal wall 226 and a lower portion of the upper end of the sleeve trapped in the space 230 behind the wall 228.

As a result the capillary is readily supported by the structure molded into the front edge 216 of the deck, and, is supported in close proximity to the heat exchanger 20. Referring to FIG. 3, when the filter 212 is slid into place in front of the sleeve 220 it slides downward smoothly in front of the sleeve without interference. No further retainers are needed to positively retain the capillary and its sleeve 220 in position.

Condensate Handling System

Conventional condensate handling systems in a room air conditioner include means for collecting condensate water draining from the inside heat exchanger and directing the collected condensate to the outside section of the air conditioner where a slinger, usually a "ring" type slinger attached to the periphery of a vertically disposed outside fan will distribute the condensate to the outdoor coil. The present air conditioning unit 10 differs from typical prior art systems in that the outdoor fan 30 and fan motor 31 are oriented vertically and accordingly an unconventional slinger design is required. Further, unlike most room air conditioners as a result of the arrangement of the outdoor fan and the outdoor fan inlet 34 the outdoor section 14 is pressurized by the fan.

Looking now at FIG. 7 the condensate pan 56 of the present air conditioning unit 10 is shown as it is mounted in the basepan 42. The condensate pan 56 comprises an elongated trough 36 which collects condensate dripping from the inside heat exchanger 20. The trough 56 makes a right angle turn and communicates through an extension of the pan 56 with a condensate opening 238 provided in the wall of the partition 44. Condensate collecting in the trough passes through the opening 238 and through an appropriate condensate channelling recess 240 formed in the basepan which communicates with a condensate well 242 also molded in the basepan, both of which are illustrated in FIG. 6.

FIG. 8 illustrates a typical prior art indoor-outdoor transition, showing water passing from the trough 236 of the condensate pan 56 through the opening 238 in the partition wall and into the condensate recess 240 of the basepan. As illustrated in FIG. 8, while the flow of condensate water is readily facilitated by such an arrangement, pressurization of the outside section 14 of the unit can result in air and water carried by the air being blown from the outside section to the inside section to the extent that water over flows the condensate pan and the basepan and leaks from the unit on the indoor side.

According to the present invention, and as illustrated in FIG. 9, a condensate outlet hood 244 is molded into the partition wall 44 on the outside section of the unit. This hood 244, as is illustrated in FIG. 9 extends downwardly into the condensate recess 240 formed in the basepan on the outside of the unit to thereby place the condensate water outlet so that it is below the outdoor water level 245 formed in the basepan. As a result of the condensate outlet being below the normal water level, not only is leaking due to air flow from outside to inside stopped, but, it also acts as an air seal which prevents thermal losses due to air migrating from the outside section to the inside section.

Looking now at FIGS. 41 through 43A the outside fan motor 31, in addition to driving the outside fan 30, also directly drives through a shaft extension 246 a condensate slinger 248. This slinger 248 extends into the condensate drain collector well 242.

The slinger 248 is of the cone pump type and has the overall shape of a truncated cone. Slopping conical wall 250 has a upper end that defines an open top and extends from the open top to a lower end closed by a bottom 252. A socket 254 is affixed to the center of the bottom 252 and rises along the longitudinal axis of the cone to provide means for attaching the slinger 248 to the shaft extension 246.

In the illustrated embodiment there are three holes 254 provided in the bottom 252 of the slinger. Each of these holes is provided with a flush louver configuration 256 as best shown in FIG. 43A. Each of these louvers comprises a slanted surface extending from the upper surface of the bottom 252 to the lower surface thereof where it defines a leading edge 258. When the leading edge is immersed in condensate in the condensate well 242 it facilitates pumping water into the interior of the slinger. It should be appreciated that the rotation of the fan motor and the slinger is such that the leading edge 258 moves in the direction illustrated in FIG. 43A to encourage the pick up of condensate.

The condensate collection well 242 is configured to have a flat bottom and slanted sides which conform somewhat to the shape of the slinger. Also when the slinger is operatively positioned in the well the bottom of the slinger is spaced very closely to the bottom of the well, a preferred spacing is approximately a ¼ of an inch.

As a result of the described arrangement, when the slinger bottom 252 is immersed in liquid, liquid flows into the interior of the slinger through the louvered holes 254. Rotation of the slinger accordingly results in a centrifugal force which causes the liquid passing into the interior of the slinger to be drawn away from the axis of the slinger and up the interior of the slopping conical wall 250. When the liquid reaches the top of wall 250 it continues to flow upward and outward away from the slinger 248 as indicated by the upper arrows 260 in FIG. 41.

At the same time, water picked up on the outside of the conical wall 250 is also caused to be slung outward and is deflected off the slanted sides 262 of the recess 240 further resulting in spray being directed toward the outdoor coil 28 as indicated by the lower arrows 264. The result is an extremely quiet slinger resulting in spray being thrown over the entire outside coil 28.

It should be appreciated that the water spray is carried by the outside air passing through the outdoor heat exchanger 28 where, because of the elevated temperature of the heat exchanger, the water evaporates. The resulting water vapor is then carried out of the air conditioning system 10 with the existing air. The condensate formed in the inside heat exchanger 20 is thus disposed of without the need of drains or other means of condensate disposal. Disposing the water onto the outside heat exchanger 28 is extremely desirable in that it improves the overall operating efficiency of the system 10 as the transfer of heat necessary to vaporize the condensate serves to cool the hot refrigerant flowing through the outside heat exchanger 28.

Compressor Mounting Stud

Referring now to FIGS. 5 and 6 the molded stud mounting arrangement of the present invention is shown at 266 as applied to a horizontal rotary compressor 32 which is mounted to the basepan 42 of the outdoor section 14 of the air conditioning unit 10. The compressor 32 includes a plurality of mounting devices not shown which mounts the compressor directly to a mounting plate 268. The mounting plate in turn is attached directly to the basepan 42 with the compressor mounting devices 266 in accordance with the present invention.

Figure 39:
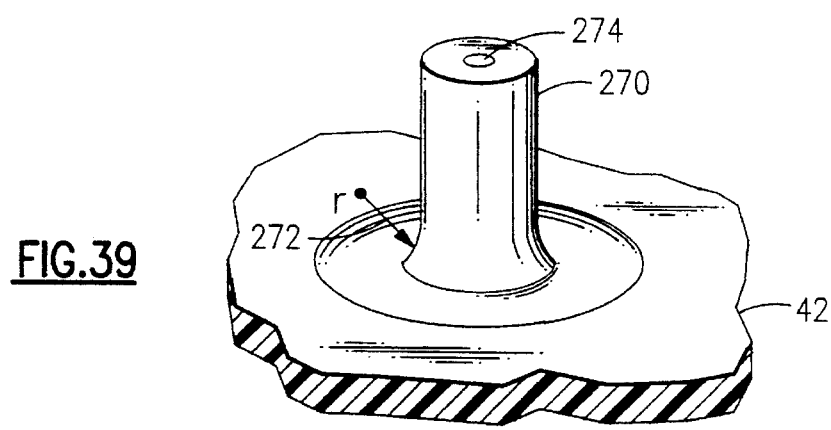
FIG. 39 is a perspective showing of the polymer stud, molded into the base pan of the air conditioner of FIG. 1, for use in mounting the compressor.
Figure 40:
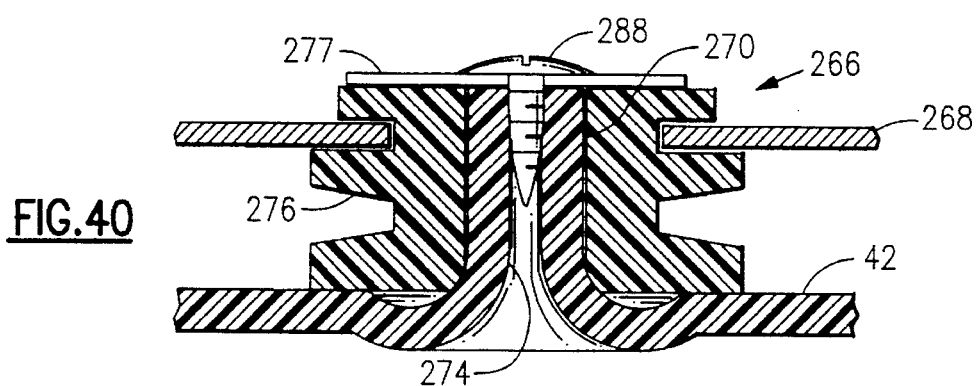
FIG. 40 is a sectional view through the stud as shown in FIG. 39 illustrating the details of the support of the compressor mounting plate thereby.

A compressor mount 266 is shown in detail in FIGS. 39 and 40 wherein the mounting is accomplished by assembly of the mounting plate 268 directly to a compressor stud 270 which is molded from the same polymer material as the basepan as a integral part of the basepan mold. As is evident from the drawings figure the stud is molded with a design radius 272 where it meets the basepan in order to impart the necessary strength to the stud. A central opening 274 is molded directly into the stud which facilitates the simply mounting arrangement of the present invention.

Mounting of the compressor and mounting plate is then achieved by first assembling elastomeric isolator grommets 276 to each of the three openings provided in the compressor mounting plate 268. The mounting plate 268 with the compressor mounted thereupon is then set in place with the three integrally formed studs 270 passing through each of the grommets 276. A simple "fender" washer is then placed over each of the grommets with its central opening in alignment with the opening 274 in the stud. A simple screw, such as a #8-B sheet metal screw 278 is then threaded directly into the opening 274 in the stud and tightened to a predetermined torque to avoid stripping of the threads formed within the openings 274 as the screw is attached thereto.

As thus mounted the compressor is mounted through the mounting plate 268 to the integrally formed studs in a manner which is extremely simple, inexpensive and easy to accomplish.

In a preferred embodiment the basepan 42 and the integrally molded studs are formed from a foamed glass-filled polycarbonate. The studs are formed with a radius of between 2.0 to 4.0 mm, a 3.0 mm radius being preferred. The through openings in the studs are 3.56 mm in diameter for use with #8-B sheet metal screws. The specified torque for this combination is 12.5 inch-lbs.

Inside Air Discharge Assembly

As seen generally, and in a simplified manner in FIGS. 1, 4 and 6 the inside air discharge assembly 26 comprises the discharge deck 142 mounted at the top front of the unit and the air deflector assembly 146 mounted in the rectangular opening 144 in the top of the deck.

Figure 45:
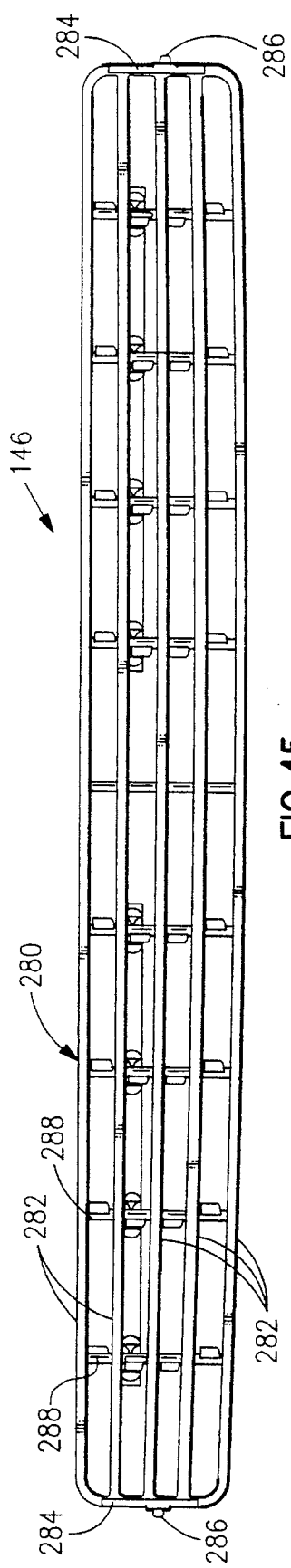
FIG. 45 is a top view of the air deflector assembly removed from the discharge deck.

The air deflector assembly 146 comprises a one piece elongated discharge louver unit 280 best shown in FIGS. 45 and 46. The louver unit comprises five angularly disposed horizontal parallel spaced louvers 282. The top and bottom louvers 282 extend into end portions 284 of the louver unit to form a substantially continuous outer periphery of the louver unit. Each of the ends 284 is provided with a molded in mounting pin 286 each of which is adapted to be receive in mating openings (not shown) provided in the left and right hand ends of the rectangular opening 144 in the discharge deck 142. FIG. 146 shows across section of the discharge louver unit mounted within the discharge deck. It is will be noted in FIG. 46 that the discharge deck 142 is inclined slightly forward from the horizontal. Such inclination and the configuration of the downwardly extending portion 56 of the discharge deck 142 which defines the outlet path of the fan cooperate to encourage discharge of air forwardly into the room being cooled. Further, the pivotally mounted discharge louver unit 280 as shown in FIG. 46 may be pivoted forward about the pins 286 to further direct air discharge therethrough in a forward direction into the room being cooled.

With reference to FIG. 45 the individual louvers 282 are interconnected at their rearward or trailing edges by a plurality of perpendicular connecting ribs 288, which are circular in cross section as shown in FIGS. 48, 49, 51 and 52. Mounted to the connecting ribs 288 are two sets 290 of ganged air deflector assemblies. With reference to FIG. 45 it will be seen that a first set of deflectors 290 is mounted on the four ribs 288 on the right side of the louver unit 280 and a second set is mounted on the four ribs 288 on the left side of the louver unit 280. The units are identical and as will be seen, because they are independently mounted, may each be used to direct discharge air to the left or right or any position in between.

Each individual deflector 292 comprises a planar portion 294 and includes a plurality of mounting tabs 296 integrally formed therewith and extruding from the front edge 298 thereof. Each of the mounting tabs 296 comprises an arcuate portion 300 thereof which is adapted to engage one side of a connecting rib 288. In the preferred embodiment as shown in FIG. 50, the right and left hand tabs 296 have their arcuate portions facing upwardly while the interior mounting tabs 296 have their actuate portions facing downwardly. FIG. 51 illustrates a deflector 292 prior to being snap fit onto its corresponding rib 288. It should be appreciated that the mounting tabs 296 are sufficiently flexible to allow outward flexing to facilitate engagement with the connecting ribs 288.

The deflector 292 shown in FIGS. 48, 49, 50, and 52 contains a finger tab 302 formed as an extension of one of the mounting tabs 296. The finger tab allows movement of the deflector and the other deflectors ganged together therewith as will be appreciated. Other deflectors in any ganged group do not require a finger tab as for example the deflector shown in FIG. 51.

As best shown in FIGS. 46 and 50 the right hand edge 304 of each of the deflectors 292 is provided with a slot 306. The slot includes a large dimension intermediate section 308 a reduced dimension 310 at the entrance thereof defined by an upstanding protrusion 310, and a very narrow slit like portion 312 extending inwardly from the intermediate section 308. The slot is adapted to receive in a snap fit fashion a "gang bar" 314 which ties the individual deflectors 292 together as will be described. It should be appreciated that the slit like portion 312 of the slot facilitates opening of the slot to receive the gang bar through the narrow section 310 into the intermediate section 308 where it is retained for motion as will now be described.

Figure 47:
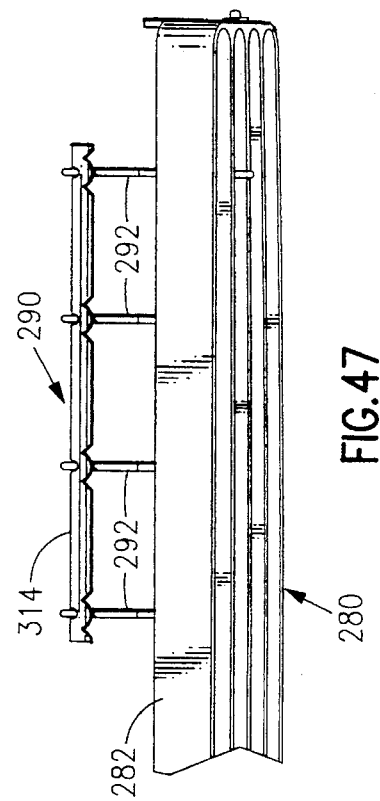
FIG. 47 is a partial plan view of the deflector assembly of FIG. 45 illustrating the engagement of several deflectors with a gang bar.

The gang bar 314 is shown interconnecting four individual deflectors 292 in FIG. 47. The bar 314 is circular in cross section except at each of the locations therealong 316 where it is configured to snap fit into the slots 306 in the deflectors 292 which it interconnects.

With reference to FIGS. 48, 49 and 50 it will be seen that each of the slot engaging locations 316 along the gang bar is provided with an arcuate shaped section 318 on one side and a slot engaging U-shaped recess 320 on the other side. The recess 320 engages and longitudinally retains the deflector 292 with respect to the bar 314. With reference to FIGS. 48 and 49 it will be appreciated how such engagement laterally fixes the deflector 292 with respect to the bar 314 and yet allows pivotal movement of the deflector with respect to the bar. With each of the deflectors in a ganged deflector unit 290 installed as described, movement of the deflector 292 having a finger tab 302 will result in parallel ganged movement of each of the deflectors in the ganged group with the gang bar 314 moving laterally from left to right to achieve the desired deflector position.

Control Box/Power Cord Strain Relief/Grounding System

As previously described the control box assembly 46 serves a number of functions in the design of the present air conditioning unit 10. Included among those described already include, housing the indoor fan motor 92, and, serving as an integral part of the support structure of the indoor fan 22 and the indoor grille 24.

Looking now at the control box in detail, FIG. 10 illustrates the box 48, with its upper 50, and lower 52 covers disassembled therefrom. In that figure the indoor fan motor 92 and the compressor capacitor 322 are also shown mounted therein in a manner which will be described. Also illustrated in FIG. 10 are the control shafts 150, 152 of the units control switch 154 and thermostat 156, respectively extending from the top 102 of the control box. For further reference, the locator pin 140 for the inside grille is also identified on the top 102 of the control box.

Figure 17:
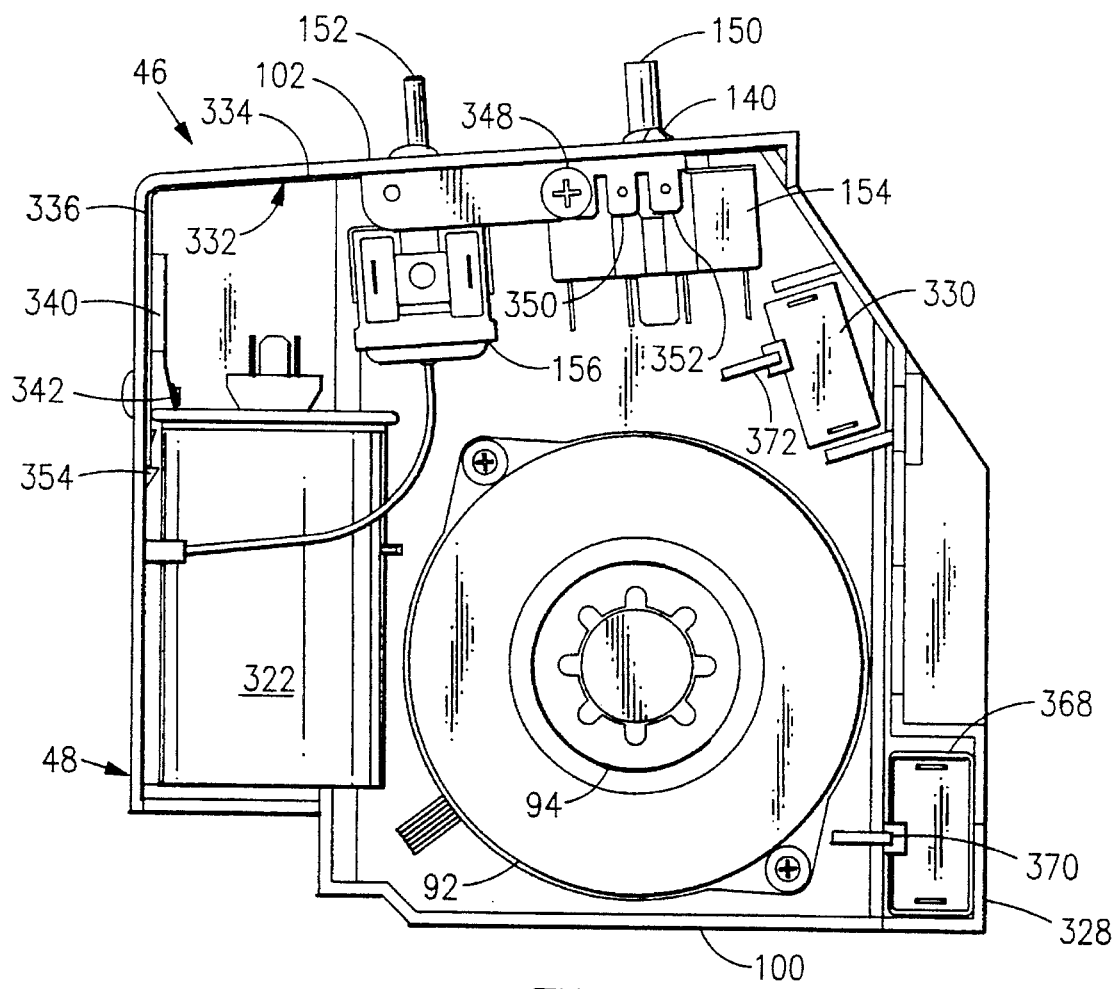
FIG. 17 is a side view of the control box with both covers removed showing the internal components mounted therein.

Looking now at FIG. 17 all of the electrical components housed within the control box 48 will be identified. It should be noted that the internal wiring of the control box is not shown in this figure facilitate illustration and description of the components. First, the previously described indoor fan motor 92 is supported by a first bushing 94 on the back side of the motor as viewed in FIG. 17 which passes through and is supported by an opening 97 in the wall 96 of the control box as illustrated in FIGS. 19 through 21. The side of the motor 92 shown in FIG. 17 includes the bushing 94 which is supported in an opening 326 provided in the lower cover 52 of the control box.

Located in the lower right hand corner is the indoor fan motor capacitor 328. Also located in the control box is the outdoor fan motor capacitor 332, the unit control switch 154, the thermostat 156 and the previously mentioned compressor capacitor 322. Also contained within the control box is an L-shaped grounding plate 332 which serves as the central grounding terminal for all of the electrical components of the present air conditioning unit 10.

It should be appreciated that the basepan 42 and all of the support and enclosing structure of the present air conditioning unit 10 is made from plastic construction. Correctly grounding all electrical devices in a manner acceptable to Underwriters Laboratories® and other safety requirement however continues to be necessary however not as easy as a unit with a metal chassis.

With reference now to FIG. 4 the grounding plate 332 consists of a horizontal leg 334 and vertical leg 336. The horizontal leg 334 has a locator tab 338 extending from the axial end thereof. The vertical leg also has formed integrally therewith a capacitor mounting tab 340, which has two stiffener ears 342, which is adapted to receive a lip 344 on the compressor capacitor 322 as will be described. The grounding plate 332 also includes a bent flange 346 which is provided with a sheet metal screw hole 348 and a pair of quick connect tabs 350 and 352.

Assembly of all of the electrical components into the control box 48 is preceded by installing the grounding plate 332 by inserting the locator tab 338 into a matching slot (not shown) in the control box 48. With reference to FIG. 10 the locator tab 338 is shown extending through the slot to the outside of the control box. The end of the vertical leg 336 of the grounding plate is snapped over a retaining rib 354 as shown in FIG. 17 to thereby mount the plate in the box.

The unit control switch 154 and the thermostat 156 are then mounted in the box so that they are in tight electrical contact with the surface of the grounding plate 332. This is accomplished by four sheet metal screws passing from the outside top 102 of the control box or, through the plate, and into the switch and thermostat as seen in FIG. 10. Tightening of the screws pulls electrically conductive surfaces on the components into conductive engagement with the plate 332.

Figure 12:
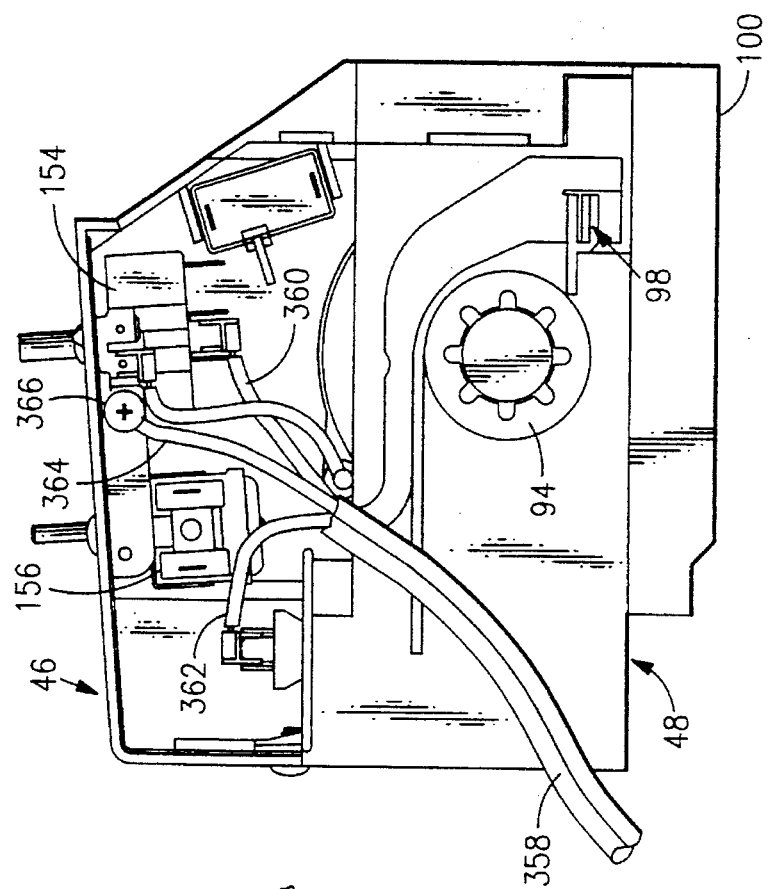
FIG. 12 is a side view of the control box with only the lower cover installed, prior to routing the power cord through the strain relief.
Figure 11:
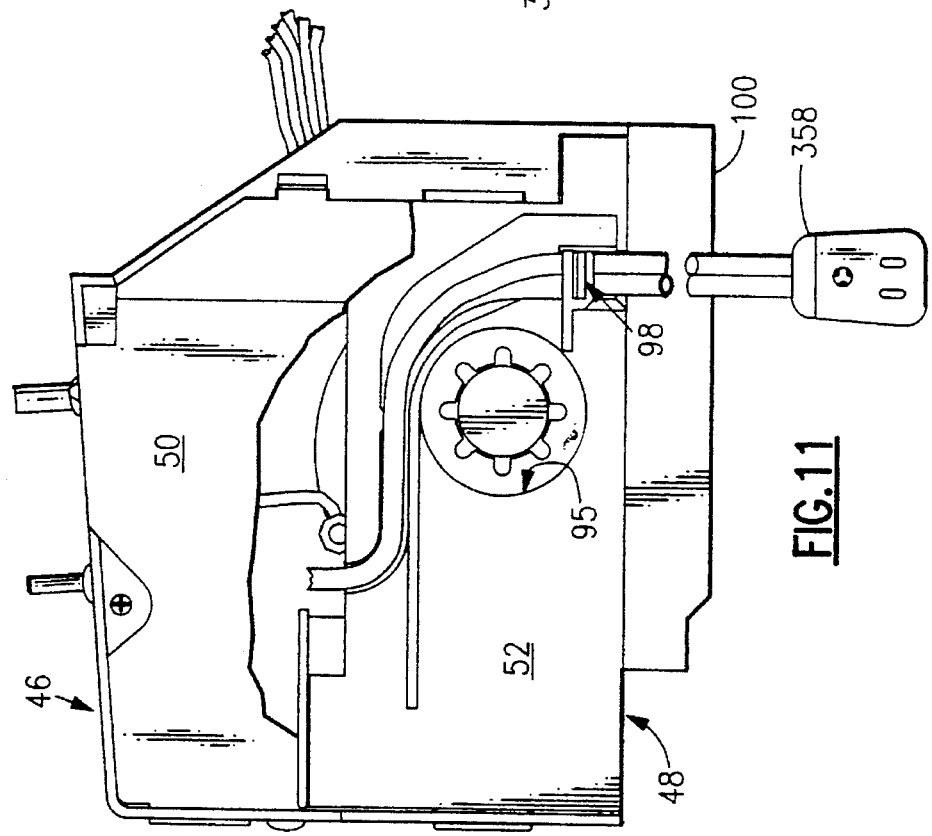
FIG. 11 is a side view of the control box with a portion of the upper cover broken away.
Figure 44:
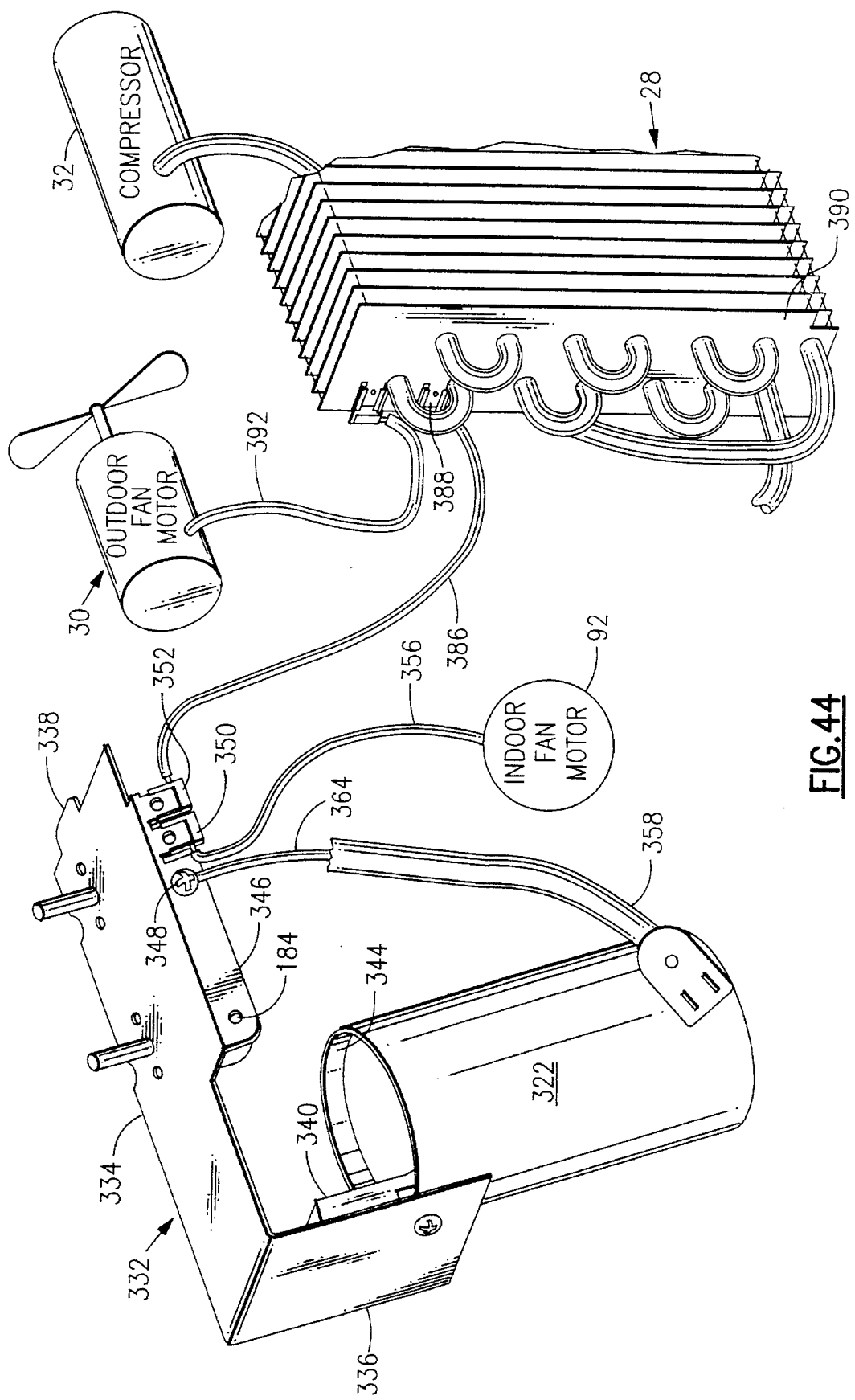
FIG. 44 is a simplified diagrammatic showing of the grounding system of the air conditioner illustrated in FIG. 1.

The compressor capacitor 322 is then placed in the box so the lip 344 is located between the vertical leg 336 and the capacitor mounting tab 340. A screw, as seen in FIGS. 17 and 44 pulls the tab 340 toward the leg 336 thus squeezing the capacitor lip 344 tightly into electrical contact with the grounding plate. The indoor motor 92 is then mounted in the control box and a grounding wire 356 from the motor is attached to the quick connect tab 350 located on the grounding plate flange 346, as shown in FIGS. 12 and 13.

The power service cord 358 is then wired into the control box with one of the power leads 360 connected to the switch 154 and the other to the compressor capacitor 322. The service cord ground wire 364 is attached to the hole 348 in the flange 346 of the grounding plate with a screw 366. The screw connection 366 is required by Underwriters Laboratories® for grounding service cords.

Appropriate wiring (not shown) is then connected to the indoor fan motor capacitor 328 and the capacitor is pushed into the control box between a pair of positioning ribs 368 until a locking ear 370 snaps over the capacitor locking it in place. Similarly, the outdoor fan motor capacitor 330 is pushed into the box until a lock ear 372 snaps over it there by locking it in place.

At this point the lower control box cover 52 is installed onto the control box 48 by inserting a tab 374 formed in one end thereof into a matting slot 376 formed in the control box 48. The opening 326 in the lower cover is pushed over the indoor motor rear mounting bushing 94. The completion of installation of the lower cover 52 is carried out by snapping a second lower cover mounting ear at the other end of the cover 378 into a mating slot 380 provided in the box. With the lower cover thus installed the indoor motor 92 is positively retained in the control box.

Completion of the grounding wiring is achieved by attaching a ground wire 386 to the second tab 352 of the flange 346 and feeding the wire through the opening 382 in the back of the control box and then through hole 384 provided in the partition 44. Also passing through the control box opening and the partition opening 384 are wires for the outdoor fan motor and the compressor.

With reference to FIG. 44 the ground wire 386 having been passed through the partition hole 384 is attached to a ground tab 388 which has been appropriately formed in the condenser coil tube sheet 390. This connection serves to ground the compressor 32 and the indoor coil 20 through the copper refrigerant piping.

The outdoor fan motor has a ground wire 392 that is also connected to a grounding tab 392 also formed in the condenser coil tube sheet 390.

In summary, the unit service cord 358 is grounded to the grounding plate 332 through a screw connection 366 as required by Underwriters Laboratories®. The switch 154, thermostat 156, and capacitor 322, are grounded by being mounted by tight contact to the grounding plate 332. The capacitor mount serves to squeeze the capacitor lip 344 to ground and mounts the capacitor without the out the use of straps or clips. The compressor 32 is connected to the condenser coil 28 by the refrigerant tubing, and the coil is grounded to the grounding plate 332 by a wire 386. The outdoor fan motor 31 is grounded through lead 392 to the condenser coil.

As thus assembled, the control box may be pulled out of the unit for service with all components remaining grounded, as is required by Underwriters Laboratories®.

Following assembly of the control box 46 with all components in place and wired, and with the lower cover 52 installed as described above the service cord 358 is engaged with the strain relief structure 98 of the present invention which is molded directly into the lower cover 52. As best seen with reference to FIGS. 10 through 16 the cord 358 is placed into an S-shaped cord receiving channel 394 formed in the lower cover. The channel runs from a narrow, entrance end thereof 396 where the flat power cord 358 is initially fed in a vertical orientation and passes through an enlarged section 398 of the S-shaped channel where the cord is then rotated ninety degrees and placed flat in the channel. The cord then passes through a path defined by a retainer ear 400, as best shown in FIGS. 14 and 15, which imparts a ninety degree bend in the cord 358.

As thus installed, when the power service cord 358 is subjected to the Underwriters Laboratories® pull test there is sufficient resistance between the cord and the tortuous path defined by the S-shaped channel 39 panel and the retainer ear 400 to pass the requirements of the UL test.

Completion of the control box assembly 46 is achieved by installing the upper cover 50 onto the box 48 by inserting a first ear 402 into a mating slot 404 in the control box and then rotating the cover downwardly and snapping a second retaining tab 406 into a receiving structure 408 in the control box 48.

Disassembly of the control box is readily accomplished by simply prying the snap on upper and lower covers from the control box retaining slots.

When the control box is fully assembled and the box is installed into the unit 10 as described above it will be recalled that the discharge deck 142 is fastened to the control box 48 by a retaining screw 180 that extends through an ear 174 forming a part of the deck 142 and through a hole in the upper cover 50 of the control box and into an opening 410 formed in the grounding plate 332. This arrangement satisfies the Underwriters Laboratories® requirement that the control box 46 may not be disassembled without the use of tools.

While the present invention has been disclosed with particular reference to a preferred embodiment incorporated into a particular room air conditioning unit, the concepts of this invention are readily adaptable to other embodiments and applications, as those skilled in the art may vary the structure thereof without departing from the essential spirit of the invention.

What is claimed is:

1. A one-piece molded strain relief structure for a flat electrical conductor having a thickner and a width comprising:

a body portion having a tortuous path molded directly therein, for receiving and guiding the conductor, said tortuous path including, an entrance and an exit, and, said path further including at least two changes in direction therealong, wherein said body portion comprises a cover for an electrical control box of an electrical appliance, wherein said body portion includes spaced apart curved walls defining an S-shaped first portion of said tortuous path extending from said entrance toward said exit for confining a first portion of said dimension the flat conductor in a first plane within said S-shaped portion, said curved walls further defining, adjacent said exit, a second portion of said tortuous path following said S-shaped portion oriented in a second plane perpendicular to said first plane for confining a second portion of said dimension the flat conductor in said second plane, and wherein the distance between said curved walls transitions from a width near said entrance substantially the same as the thickness of the conductor to a width wider than the conductor width at the second portion of said tortuous path.

2. The apparatus of claim 1 further including guide means adjacent said exit of said path for imparting a sharp bend in the conductor where said path changes orientation from being in said second plane to a third plane perpendicular to said second plane.

* * * * *